United States Patent
Lin et al.

(10) Patent No.: US 10,032,764 B2
(45) Date of Patent: Jul. 24, 2018

(54) FINFET WITH ESD PROTECTION

(71) Applicant: TAIWAN SEMICONDUCTOR MANUFACTURING COMPANY LTD., Hsinchu (TW)

(72) Inventors: Wun-Jie Lin, Hsinchu (TW); Yu-Ti Su, Tainan (TW); Li-Wei Chu, Hsinchu (TW); Bo-Ting Chen, Taichung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/257,355

(22) Filed: Sep. 6, 2016

(65) Prior Publication Data
US 2016/0379971 A1    Dec. 29, 2016

Related U.S. Application Data

(62) Division of application No. 14/259,908, filed on Apr. 23, 2014, now Pat. No. 9,461,170.

(51) Int. Cl.
| | | |
|---|---|---|
| *H01L 27/02* | (2006.01) | |
| *H01L 29/78* | (2006.01) | |
| *H01L 21/8238* | (2006.01) | |
| *H01L 29/66* | (2006.01) | |
| *H01L 27/092* | (2006.01) | |

(Continued)

(52) U.S. Cl.
CPC .... *H01L 27/0266* (2013.01); *H01L 21/76224* (2013.01); *H01L 21/823418* (2013.01); *H01L 21/823431* (2013.01); *H01L 21/823437* (2013.01); *H01L 21/823481* (2013.01); *H01L 21/823493* (2013.01); *H01L 21/823821* (2013.01); *H01L 27/027* (2013.01); *H01L 27/0924* (2013.01); *H01L 29/0649* (2013.01); *H01L 29/0847* (2013.01); *H01L 29/66545* (2013.01); *H01L 29/66659* (2013.01); *H01L 29/785* (2013.01); *H01L 29/7848* (2013.01); *H01L 27/0886* (2013.01); *H01L 2029/7858* (2013.01)

(58) Field of Classification Search
CPC ......... H01L 29/66545; H01L 29/66795; H01L 27/0924
See application file for complete search history.

(56) References Cited

U.S. PATENT DOCUMENTS

| | | |
|---|---|---|
| 7,667,271 B2 | 2/2010 | Yu et al. |
| 8,362,575 B2 | 1/2013 | Kwok et al. |

(Continued)

*Primary Examiner* — Julia Slutsker
(74) *Attorney, Agent, or Firm* — WPAT, P.C., Intellectual Property Attorneys; Anthony King

(57) ABSTRACT

In some embodiments, a field effect transistor structure includes a substrate, a fin structure and a gate structure. The fin structure is formed over the substrate. The fin structure includes a first channel region, a first source or drain region and a second source or drain region. The first source or drain region and the second source or drain region are formed on opposite ends of the first channel region, respectively. The well region is formed of the same conductivity type as the second source or drain region, connected to the second source or drain region, and extended to the substrate. The first gate structure wraps around the first channel region in the fin structure.

20 Claims, 18 Drawing Sheets

(51) Int. Cl.
*H01L 21/762* (2006.01)
*H01L 21/8234* (2006.01)
*H01L 29/06* (2006.01)
*H01L 29/08* (2006.01)
H01L 27/088 (2006.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2011/0068407 A1 | 3/2011 | Yeh et al. |
| 2013/0011983 A1 | 1/2013 | Tsai et al. |
| 2014/0092506 A1* | 4/2014 | Ahsan ............ H01L 27/027 361/56 |
| 2014/0203370 A1* | 7/2014 | Maeda ............ H01L 29/785 257/365 |
| 2014/0252412 A1 | 9/2014 | Tsai et al. |
| 2015/0014809 A1* | 1/2015 | Wang ............ H01L 29/861 257/506 |

\* cited by examiner

FINFET WITH ESD PROTECTION

PRIORITY CLAIM AND CROSS-REFERENCE

This application is a divisional application of U.S. patent application Ser. No. 14/259,908, filed on Apr. 23, 2014.

BACKGROUND

Metal oxide field effect transistors (MOSFETs) have been used as electrostatic discharge (ESD) devices. For example, a grounded-gate NMOS (ggNMOS) which is turned off in a normal mode, has a parasitic bipolar junction transistor (BJT) that exhibits a snapback behavior in an BSD mode. During the normal mode, a voltage across a drain and a source of the ggNMOS is smaller than a trigger voltage of the ggNMOS, and the parasitic BJT is cutoff. During the BSD mode, the voltage across the drain and the source of the ggNMOS reaches the trigger voltage, engages an avalanche breakdown and triggers the parasitic BJT to turn on. When a current conducted through the parasitic BJT increases, the voltage across the drain and the source of the ggNMOS first decreases and then increases, and therefore has snapped back. Further increasing the voltage across the drain and the source of the ggNMOS will eventually lead to device destruction.

Several ESD models are created for characterizing the susceptibilities of a device under test (DUT) such as the ggNMOS to damages from various ESD events, respectively. For example, a human-body model (HBM) models direct transfer of electrostatic charge through a human body. Under the HBM, an ESD current pulse applied to the DUT has, for example, a rise time of 100 ns. For another example, a charged-device model (COM) emulates the positive or negative charge built up in an integrated circuit (IC) die and package through direct contact charging or through field induced charging. The ESD is generated via direct ground contact of one of the IC's input/output (IO) pins. Under the CDM, the BSD current pulse applied to the DUT has, for example, a rise time of 1 ns. For each model, a highest stress level, such as a highest peak current, that the DUT can sustain is characterized.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
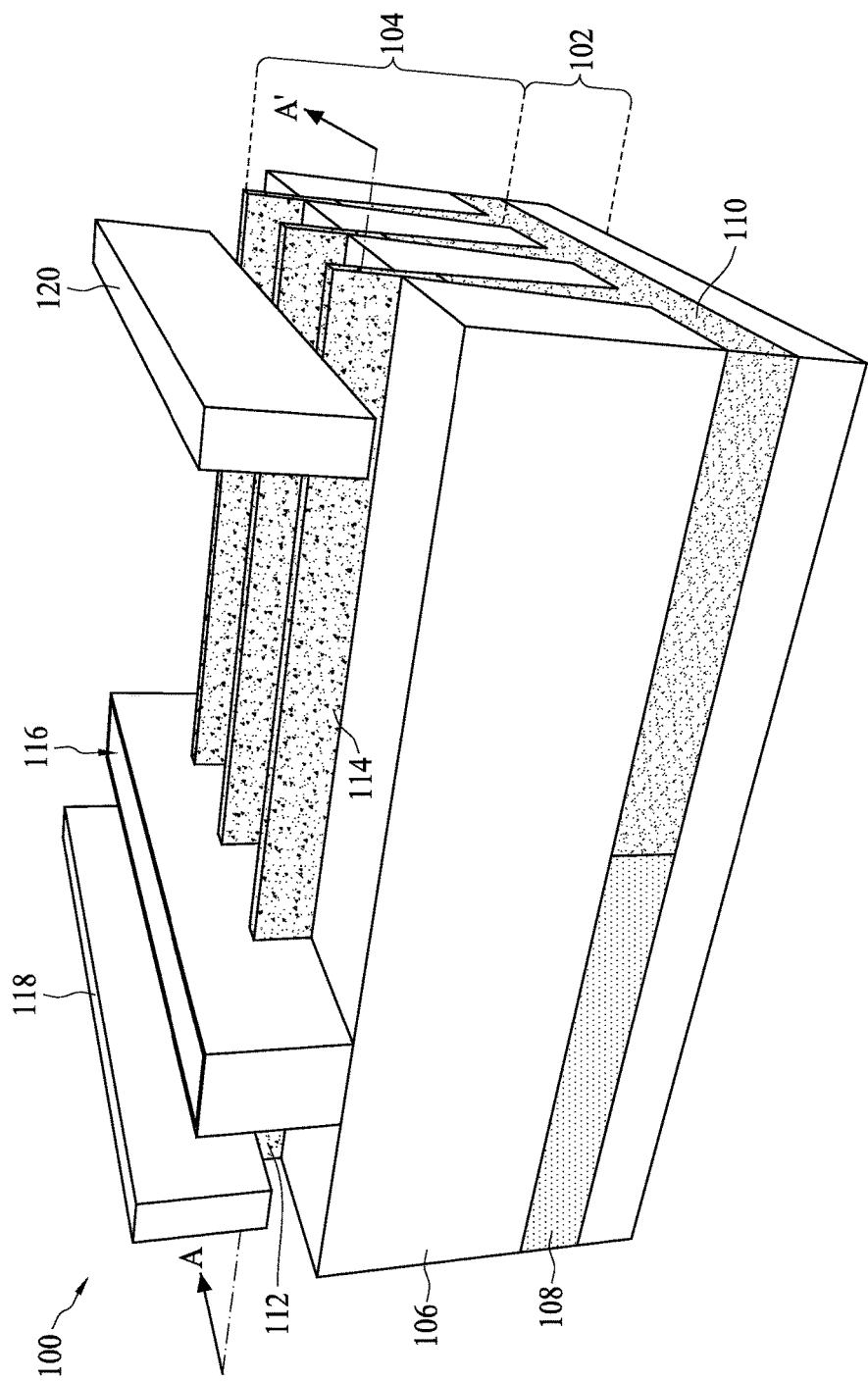
FIG. 1 is a schematic perspective diagram of a FinFET structure with ESD protection in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "upward", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a schematic perspective diagram of a FinFET structure 100 with ESD protection in accordance with some embodiments. FIG. 1 illustrates an overall structure of the FinFET structure 100. In FIG. 1, the FinFET structure 100 includes a substrate 102, several fin structures 104, several dielectric isolation regions 106, a gate structure 116 and several contacts 118 and 120. The fin structures 104 extend upward from the substrate 102. The dielectric isolation regions 106 are formed on the substrate 102 and isolate the fin structures 104. The fin structures 104 extends above the dielectric isolation regions 106. The substrate 102 and the fin structures 104 include a body region 108 and a well region 110 that extend vertically across the fin structure 104 and the substrate 102. The gate structure 116 traverses the fin structures 104 extended beyond the dielectric isolation regions 106. Each fin structure 104 further includes a source region 112 and a drain region 114 on opposite sides of the gate structure 116. The contacts 118 and 120 are coupled to the source regions 112 of the fin structures 104, and the drain regions 114 of the fin structures 104, respectively.

The fin structures 104 extend upward from a top surface of the substrate 102. In some embodiments, the top surface of the substrate 102 and the fin structures 104 are formed by bottom surfaces and side walls of trenches formed in a bulk semiconductor substrate, respectively. In some embodiments, the bulk semiconductor substrate is formed of an elementary material such as silicon, germanium in a crystalline structure. In other embodiments, the bulk semiconductor substrate is formed of a compound material such as silicon carbide, gallium arsenide, gallium phosphide, indium phosphide, indium arsenide or indium antimonide, or an alloy semiconductor material such as silicon germanium, gallium arsenide phosphide, gallium indium arsenide, gallium indium phosphide, gallium indium arsenide phosphide, or combinations thereof.

The dielectric isolation regions 106 are formed on the substrate 102 and isolate the fin structures 104. In some embodiments, the dielectric isolation regions 106 are shallow trench isolations (STIs) that are formed in the trenches in the bulk semiconductor substrate described above. The fin structures 104 extend above the dielectric isolation regions 106. In some embodiments, the dielectric isolation regions 106 include silicon oxide, silicon nitride, silicon oxy-nitride, fluoride-doped silicate (FSG), and/or a suitable low-k dielectric material.

In other embodiments, a semiconductor-on-insulator (SOI) substrate is used instead of the bulk semiconductor substrate. The fin structures are formed in a semiconductor layer over an insulator layer in the SOI substrate.

Figure 2:
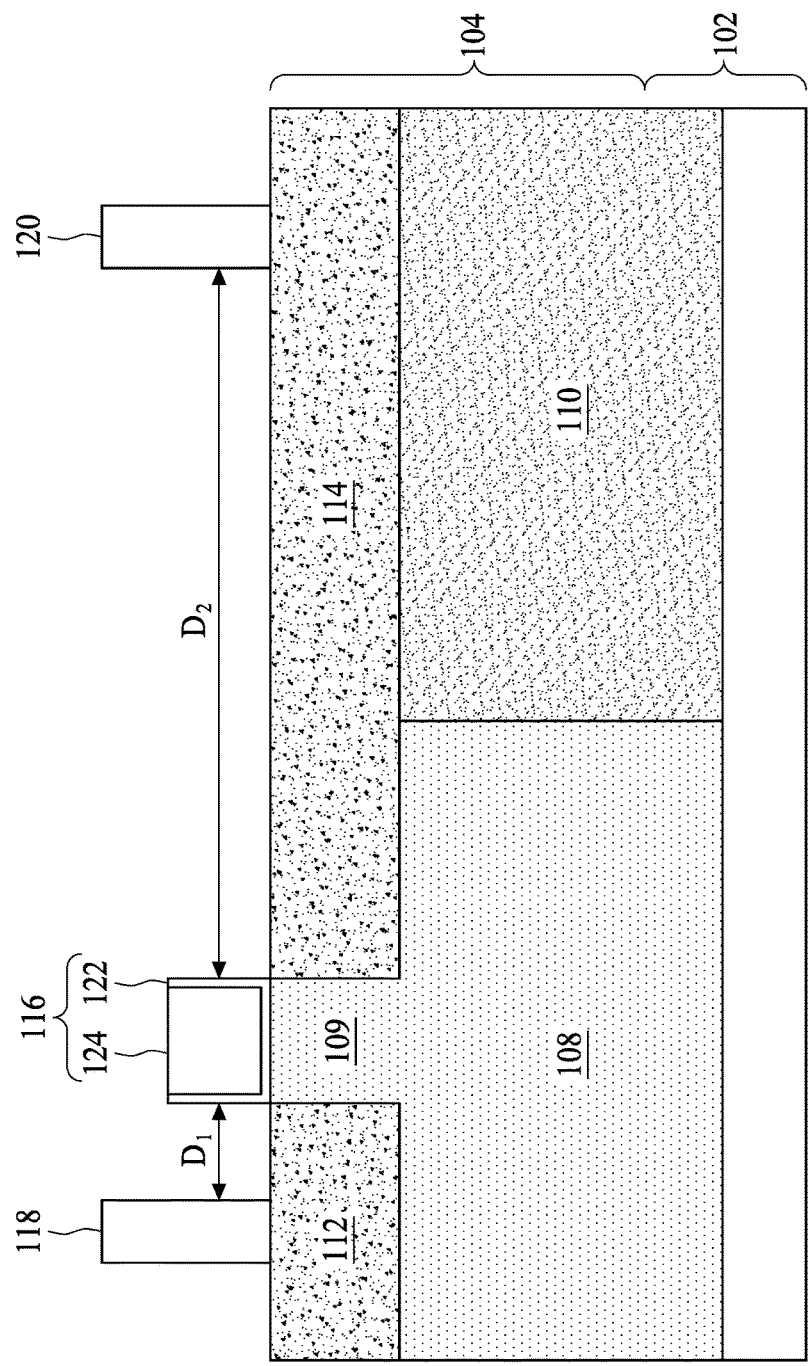
FIG. 2 is a schematic cross-sectional diagram along line A-A' in FIG. 1 in accordance with some embodiments.

FIG. 2 is a schematic cross-sectional diagram along line A-A' in FIG. 1 in accordance with some embodiments. FIG. 2 illustrates a cross-section along a length of one of the fin structures 104. The substrate 102 and the fin structure 104 include the body region 108 and the well region 110 that extend vertically across the fin structure 104 and the substrate 102. The body region 108 abuts the well region 110. The body region 108 includes a channel region 109. The fin structure 104 further includes the source region 112 and the drain region 114 formed on opposite ends of the channel region 109. Take an n-type FET as an example. In some embodiments, the body region 108 is doped with p-type dopants such as boron (B). The well region 110 is doped with n-type dopants such as arsenic (As) or phosphorus (P). The source region 112 and a drain region 114 are doped with the n-type dopants. In some embodiments, the source region 112 and the drain region 114 are more heavily doped than the well region 110.

In FIG. 1, the gate structure 116 traverses the fin structures 104. At where the gate structure 116 interfaces with each fin structure 104, the gate structure 116 wraps around the respective channel region 109. In the cross-section along the length of the fin structure 104 as shown in FIG. 2, the gate structure 116 is formed over a top side of the channel region 109. In a cross section (not shown) along a width of the fin structure 104, the gate structure 116 wraps around three sides of the channel region 109. The cross section along the width of the fin structure 104 is similar to the fin structure 104 wrapped around by the gate structure 116 shown in FIG. 1. The source region 112 and the drain region 114 are formed on the opposite sides of the gate structure 116. As a result, the source region 112 and the drain region 114 are located on the opposite ends of the channel region 109 underlying the gate structure 116.

Referring to FIG. 2, in some embodiments, the gate structure 116 includes a gate dielectric 122 and a gate electrode 124. The gate dielectric 122 includes one or more dielectric conformally formed over the channel region 109. In some embodiments, the gate dielectric 122 further forms side walls of the gate structure 116. In some embodiments, the gate dielectric 122 includes a high-k dielectric material such as $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO or combinations thereof. The gate electrode 124 includes one or more work function metal layers (not illustrated) and a fill metal (not illustrated). The one or more work function metal layers are conformally formed over the gate dielectric 122 for adjusting a work function of the gate electrode 124. The fill metal fills the remaining space of the gate structure 116 for serving as the main conductive portion of the gate electrode 124. In some embodiments, the one or more work function metal layers include TaC, TaN, TiN, TaAlN, TaSiN or combinations thereof. In some embodiments, the fill metal include W, Al, Cu, or combinations thereof.

Referring to FIG. 1, the contact 118 couples the source regions 112 of the fin structures 104 together. The contact 120 couples the drain regions 114 of the fin structures 104 together. In some embodiments, the contact 118 or 120 is formed in an opening or a via between the source regions 112 or drain regions 114 and a metal layer (not shown) for connections to other circuit components. The contact 118 or 120 includes a silicide material and a metal material. The silicide material is used at a semiconductor-metal junction to facilitate efficient junction. Exemplary silicide materials include tungsten silicide, titanium silicide, cobalt silicide, nickel silicide, platinum silicide, erbium silicide, and combinations thereof. Exemplary metal materials include tungsten, titanium, aluminum, copper, molybdenum, nickel, platinum, etc.

Referring to FIG. 2, the FinFET structure 100 (shown in FIG. 1) serves as a functional FET. Take the n-type FET as an example. During a normal mode, a voltage across the contact 120 of the drain region 114 and the contact 118 of the source region 112 is below a trigger voltage, and the FET operates normally in a linear region or a saturation region. A current flows from the contact 120, the drain region 114, the channel region 109, the source region 112, to the contact 118.

In addition, the FET structure 100 also serves as an ESD protection device. The FET structure 100 includes a parasitic NPN BJT. The drain region 114 and the well region 110, the body region 108, and the source region 112 form a collector, a base and an emitter of the BJT, respectively. During an ESD mode, the voltage across the contact 120 of the drain region 114 and the contact 118 of the source region 112 reaches the trigger voltage, a p-n junction between the body region 108, and the drain region 114 and the well region 110 enters into an avalanche breakdown stage. During this stage, an injected current from the drain region 114 and the well region 110 to the body region 108 causes a base to emitter voltage to increase. When the base to emitter voltage increases to, for example, about 0.5 V, the BJT turns on. An ESD current can therefore flows from the contact 120, the drain region 114, the well region 110, the body region 108, the source region 112 to the contact 118.

In some embodiments, in order to facilitate the ESD current to discharge through the parasitic BJT and not through the channel region 109, a resistance of the drain region 114 in a path through the channel region 109 is increased by, for example, increasing a distance between the contact 120 and the gate structure 116. Therefore, a distance $D_2$ between the contact 120 and the gate structure 116 is larger than a distance $D_1$ between the contact 118 and the gate structure 116. The increased resistance of the drain region 114 helps the ESD current to flow through the path of the parasitic BJT and not through the path of the channel region 109 which can be damaged by the ESD current due to a high current density.

Figure 3:
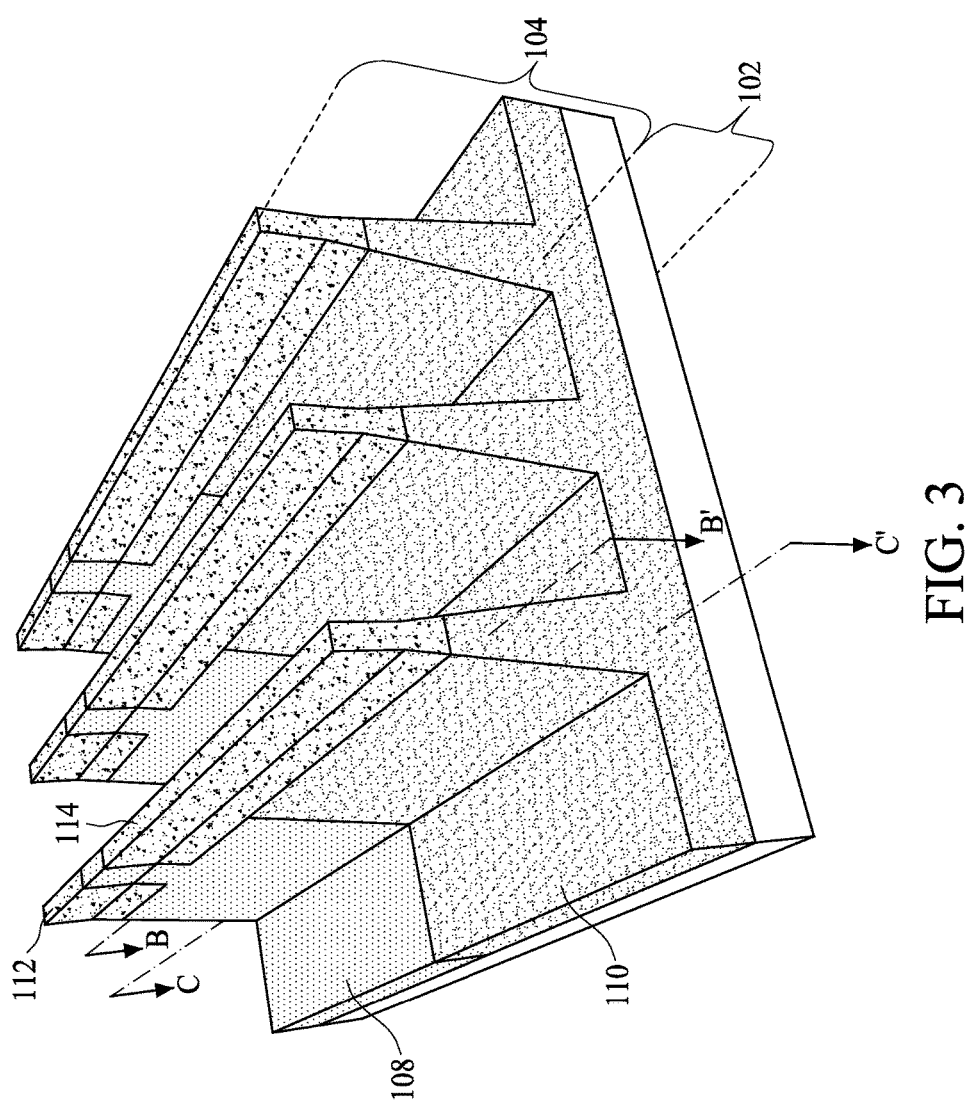
FIG. 3 is a schematic perspective diagram of the fin structures and the substrate of the FinFET structure in FIG. 1 in accordance with some embodiments.

FIG. 3 is a schematic perspective diagram of the fin structures 104 and the substrate 102 of the FinFET structure 100 in FIG. 1 in accordance with some embodiments. Some portions of the FinFET structure 100 such as the dielectric isolation regions 106, the gate structure 116 and so on are removed for showing the well region 110 with a greater clarity. In order to guide the ESD current through the fin structure 104 of narrower widths down to the substrate 102 of a wider width, the well region 110 extends from the drain region 114 to the substrate 102 is formed. In this way, the injected current from the drain region 114 and the well region 110 during the avalanche breakdown stage reaches deep down to the body region 108 in the substrate 102. Therefore, the base to emitter voltage between the body region 108 in the substrate 102 and the source region 112 also reaches the turn on voltage of the BJT. The ESD current flows substantially vertically from the drain regions 114 and portions of the well region 110 in the fin structures 104 to a portion of the well region 110 in the substrate 102, and then flows substantially laterally from the portion of the well region 110 in the substrate 102 to a portion of the body region 108 in the substrate 102, and then flows substantially vertically from the portion of the body region 108 in the substrate 102, portions of the body region 108 in the fin structures 104 to the source regions 112.

Figure 4:
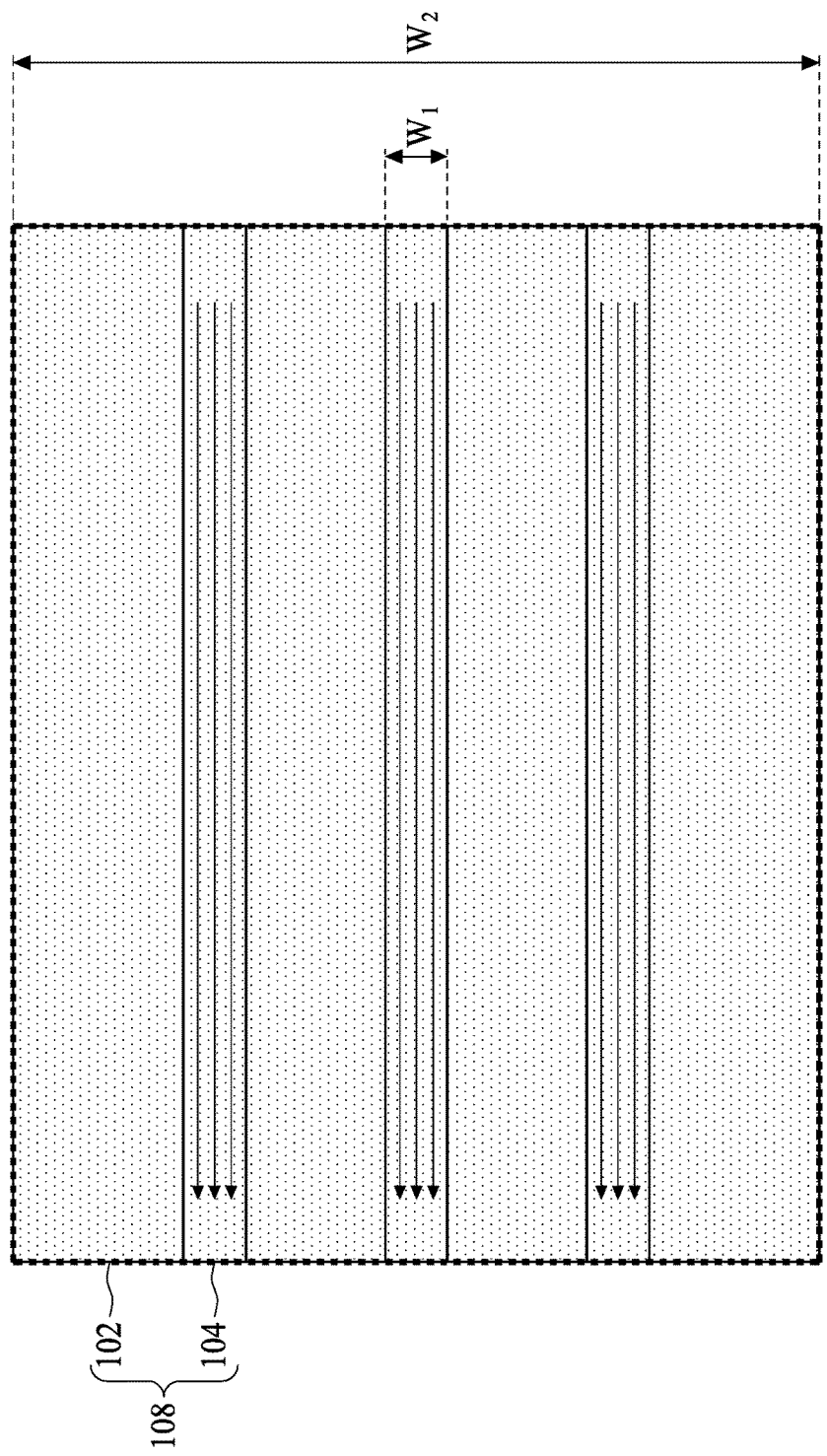
FIG. 4 is a schematic diagram illustrating superimposed cross-sections along a line B-B' and along a line C-C in the FIG. 3 without the well region.

For a comparison purpose, suppose the FinFET structure 100 does not have the well region 110 in FIG. 3. The body region 108 extends to the location of the well region 110. FIG. 4 is a schematic diagram illustrating superimposed cross-sections along a line B-B' and along a line C-C' in the FIG. 3 without the well region 110. The body region 108 includes portions in the fin structures 104 and a portion in the substrate 102. The cross-section along the line B-B' shows the body region 108 in the fin structures 104. The cross-section along the line C-C shows the body region 108 in the substrate 102. Without the well region 110, it is harder for the injected current from the drain region 114 to reach deep down to the body region 108 in the substrate 102. Therefore, it is more difficult for the base to emitter voltage between the body region 108 in the substrate 102 and the source region 112 to reach the turn on voltage of the BJT. The ESD current from the drain region 114 (shown in FIG. 3) flows more through the body region 108 in the fin structures 104 to the source region 112 (shown in FIG. 3) in the fin structure 104 and less through the body region 108 in the substrate 102. Because the ESD current is mostly concentrated in the fin structures 104 that has a total width of $3W_1$, and not dispersed to the substrate 102 that has a width of $W_2$, a local crowding effect of the ESD current density distribution over the p-n junction of the body region 108 and the drain region 114 is exacerbated. Under the test for CDM, the ESD current pulse has a smaller rise time to reach the peak current than those of other ESD models. Because the rise time requirement of the CDM is more stringent, and the discharge path of the ESD current is more susceptible to the local crowding effect, the peak current that the device can sustain without device destruction due to localized overheating or electromigration is around 5 A, which is shown to be lower than that of the FinFET structure 100 with the well region 110 to be described below.

Figure 5:
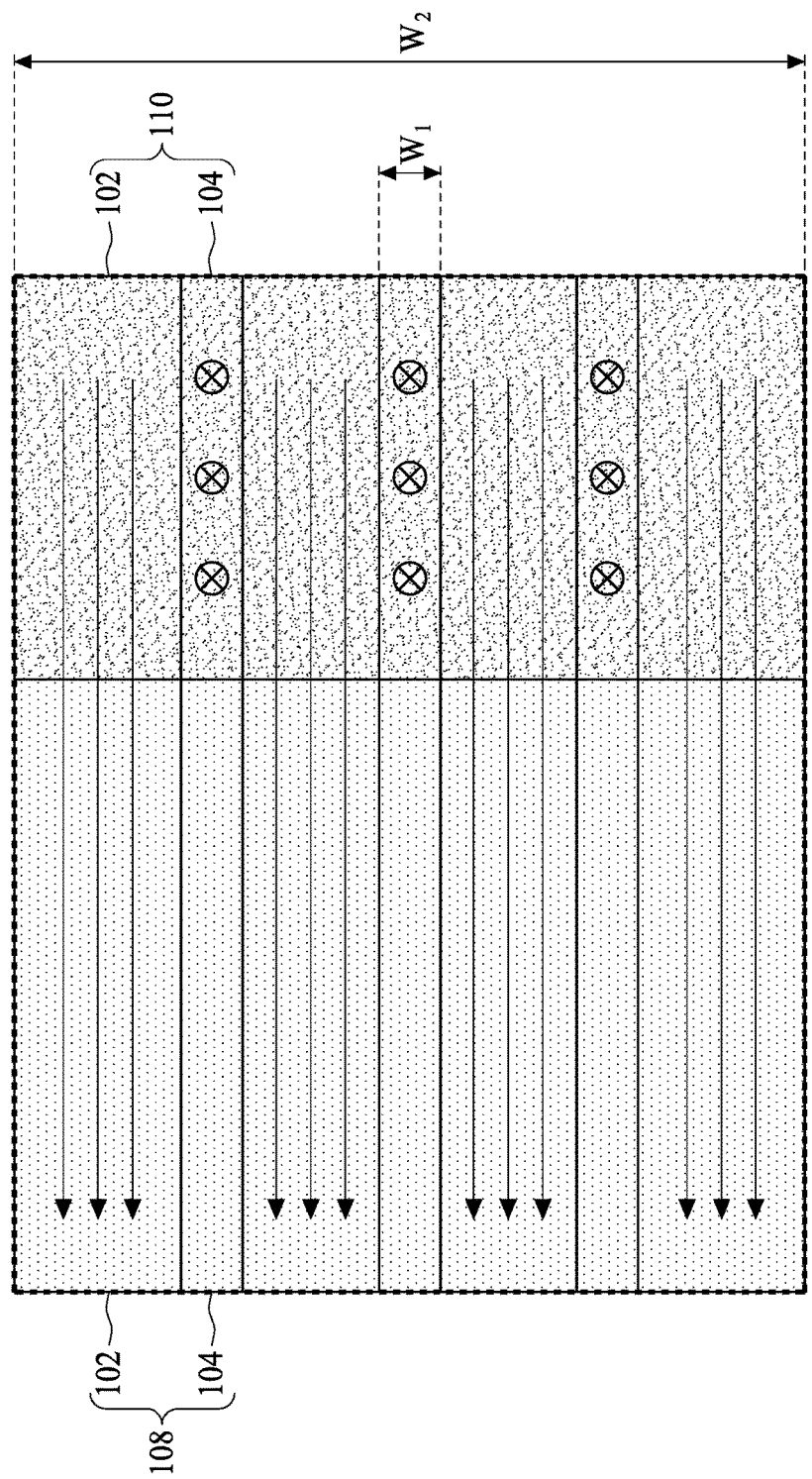
FIG. 5 is a schematic diagram illustrating superimposed cross-sections along a line B-B' and along a line C-C in FIG. 3 in accordance with some embodiments.

FIG. 5 is a schematic diagram illustrating superimposed cross-sections along a line B-B' and along a line C-C' in FIG. 3 in accordance with some embodiments. The body region 108 includes the portions in the fin structures 104 and the portion in the substrate 102. The well region 110 also includes the portions in the fin structures 104 and the portion in the substrate 102. The cross-section along the line B-B' shows the body region 108 and the well region 110 in the fin structures 104. The cross-section along the line C-C' shows the body region 108 and the well region 110 in the substrate 102. With the well region 110, some of the ESD current from the drain region 114 (shown in FIG. 3) flows downward through the well region 110 in the fin structures 104 to the substrate 102, and then substantially laterally through the well region 110 and the body region 108 in the substrate 102 to the source region 112 (shown in FIG. 3). Some of the ESD current goes through the well region 110 and the body region 108 in the fin structures 104. Because the ESD current is dispersed to the fin structures 104 and the substrate 102 that has a total width of $3W_1+W_2$, the local crowding effect is alleviated. Even with the more stringent rise time requirement under the CDM model, the FinFET structure 100 can sustain a peak current of about 12 A, which is higher than the FinFET structure 100 without the well region 110 described with reference to FIG. 4.

Figure 6:
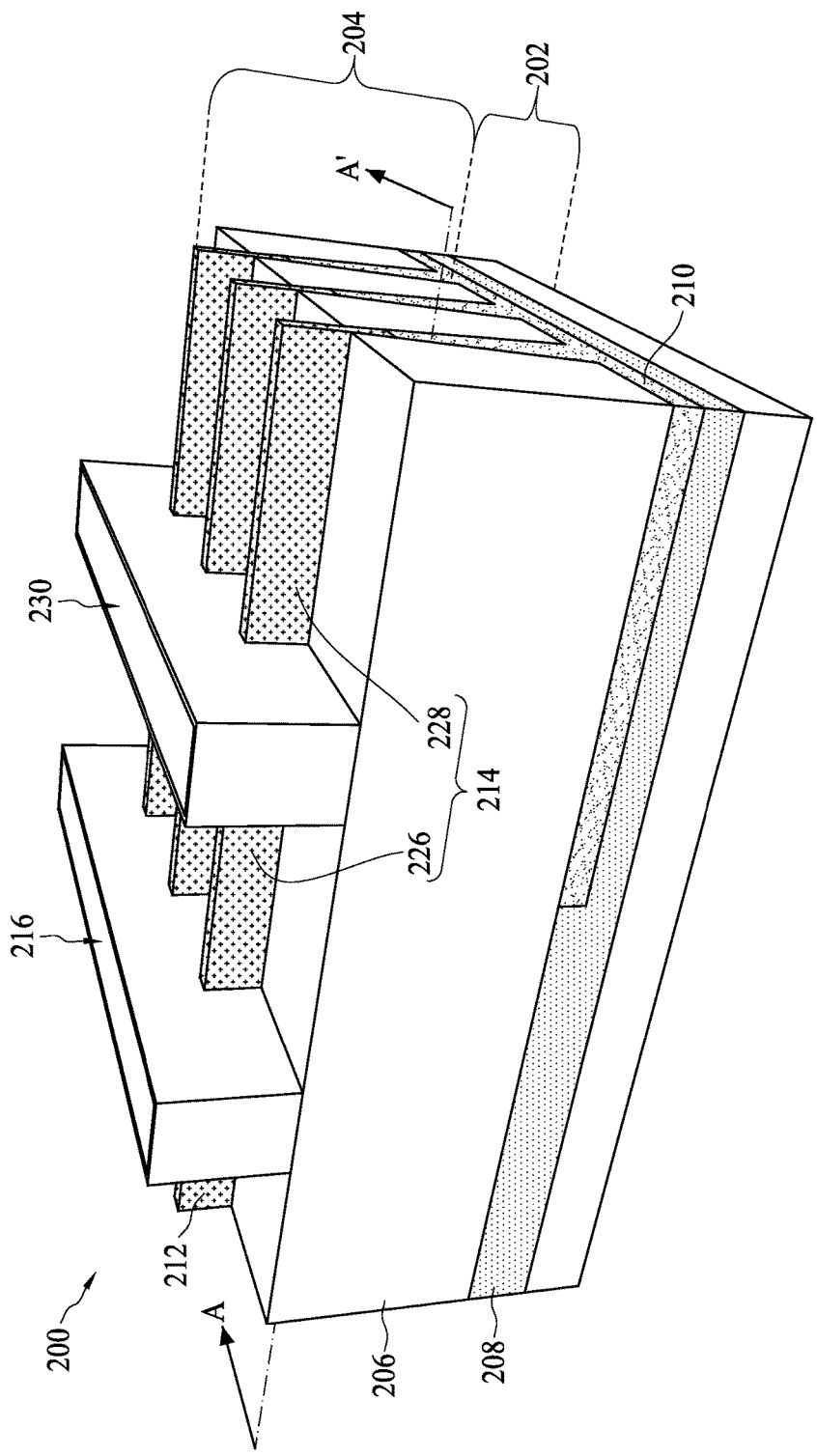
FIG. 6 is a schematic perspective diagram of a FinFET structure with ESD protection in accordance with other embodiments.

FIG. 6 is a schematic perspective diagram of a FinFET structure 200 with ESD protection in accordance with other embodiments. Compared to the FinFET structure 100 in FIG. 1, the FinFET structure 200 has an embedded source region 212 and an embedded drain region 214 that includes a stressor material. The embedded drain region 214 is separated into two sections 226 and 228 by a dummy gate structure 230. The FinFET structure 200 includes a substrate 202, several fin structures 204, several dielectric isolation regions 206, a gate structure 216, a dummy gate structure 230, and contacts 218 and 220. For simplicity, the contacts 218 and 220 are shown in a cross-sectional diagram in FIG. 7 but not in FIG. 6. The elements of the FinFET structure 200 with corresponding reference numerals to the elements of the FinFET structure 100 in FIG. 1 are similar. Only the differences between the FinFET structure 100 and the FinFET structure 200 are illustrated below.

Figure 7:
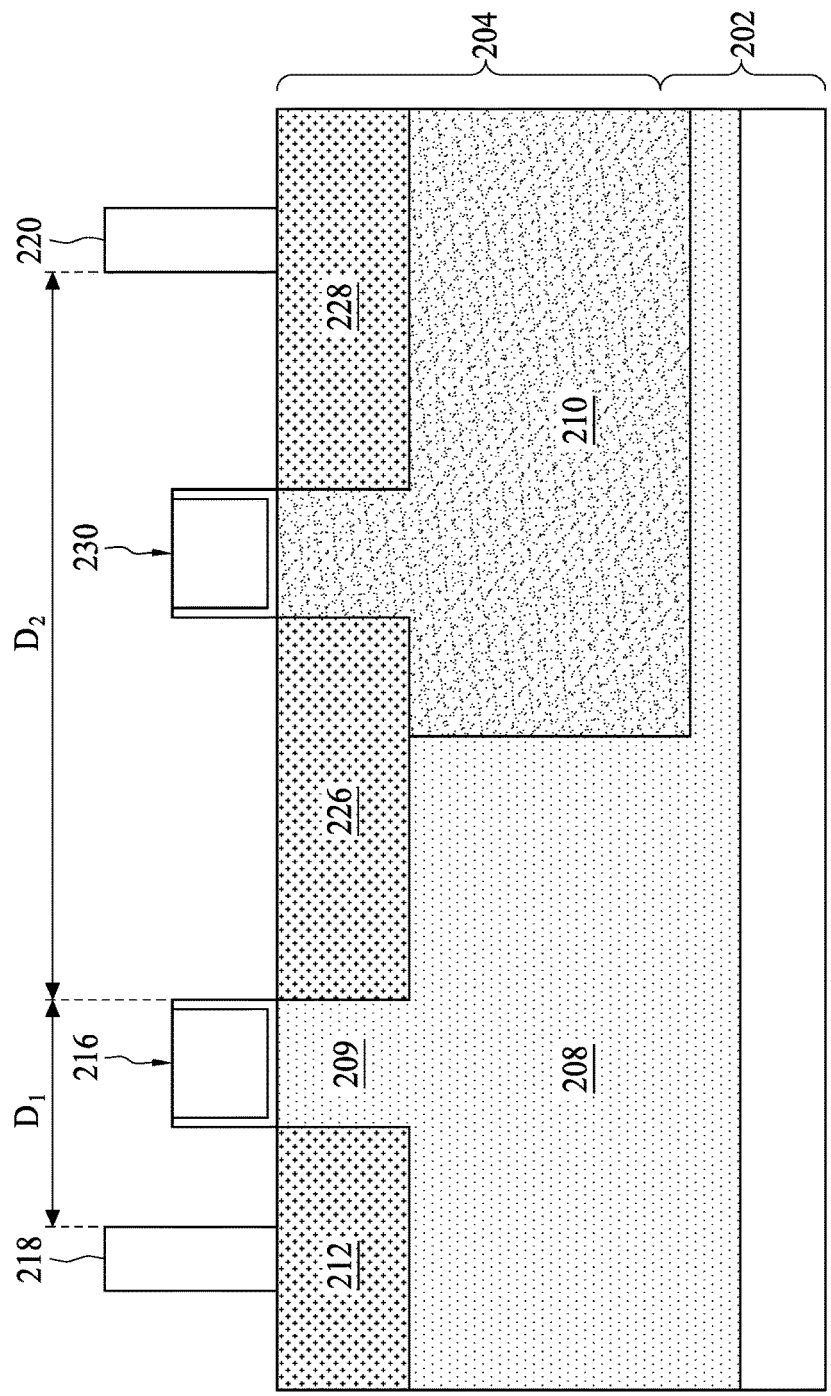
FIG. 7 is a schematic cross-sectional diagram along line A-A' in FIG. 6 in accordance with some embodiments.

FIG. 7 is a schematic cross-sectional diagram along line A-A' in FIG. 6 in accordance with some embodiments. Similar to the embodiments described with reference to FIG. 2, the substrate 202 and the fin structure 202 include the body region 208 and the well region 210. The body region 208 includes a channel region 209. The fin structure 202 further includes the embedded source region 212 and the sections 226 and 228 of the embedded drain region 214 (labeled in FIG. 6). The embedded source region 212 and the section 226 are formed on opposite ends of the channel region 209, or in other words, on opposite sides of the gate structure 216. The sections 226 and 228 are formed on opposite sides of the dummy gate structure 230. The embedded source region 212 and embedded drain region 214 includes the stressor material that has a lattice constant different that of the channel region 209. The lattice mismatch introduces a mechanical strain to the channel region 209 that enhances a carrier mobility. For example, when the channel region 209 is formed of silicon, for an n-type FET, the stressor material is epitaxial silicon carbide, and for a p-type FET, the stressor material is epitaxial silicon germanium.

In some embodiments, the well region 210 connects the sections 226 and 228 of the embedded drain region 214 (labeled in FIG. 6). During the normal mode of the FinFET structure 200 (shown in FIG. 6), the current flows from the contact 220, the section 228, the well region 210 between the section 228 and the section 226, the section 226, the channel region 209, the embedded source region 212 to the contact 218.

During the ESD mode of the FinFET structure 200, in order to facilitate the ESD current to discharge through the parasitic BJT and not through the channel region 209, a resistance of the embedded drain region 214 in a path through the channel region 209 is increased. Therefore, a distance $D_2$ between the contact 220 coupled to the section 228 of the embedded drain region 214 and the gate structure 216 is larger than a distance $D_1$ between the contact 218 coupled to the embedded source region 212 and the gate structure 216. For comparison purpose, suppose the dummy gate structure 230 is not present and the sections 226 and 228 of the embedded drain region 214 are integrated into one region. Due to a loading effect that occurs during epitaxial growth of the embedded source and drain regions 212 and 214, the growth rate of the stressor material is not uniform across source and drain recesses in which the stressor material is to be grown. The non-uniform growth rate of the stressor material can cause the embedded drain region 214 to have a lower height than the embedded source region 212, and therefore not connected adequately to the contact 220. By introducing the dummy gate structure 230, the embedded drain region 214 is divided into the sections 226 and 228. The section 226 or 228 has a size that is more compatible with that of the embedded source region 212 and therefore, a more uniform epitaxial growth rate across the embedded source and drain regions 212 and 214 is achieved. The embedded drain region 214 can be further lengthened by inserting more dummy gate structures 230 to further increase the resistance of the discharge path through the channel region 209 while maintaining a substantially uniform epitaxial rate for the embedded source and drain regions 212 and 214.

Figure 8:
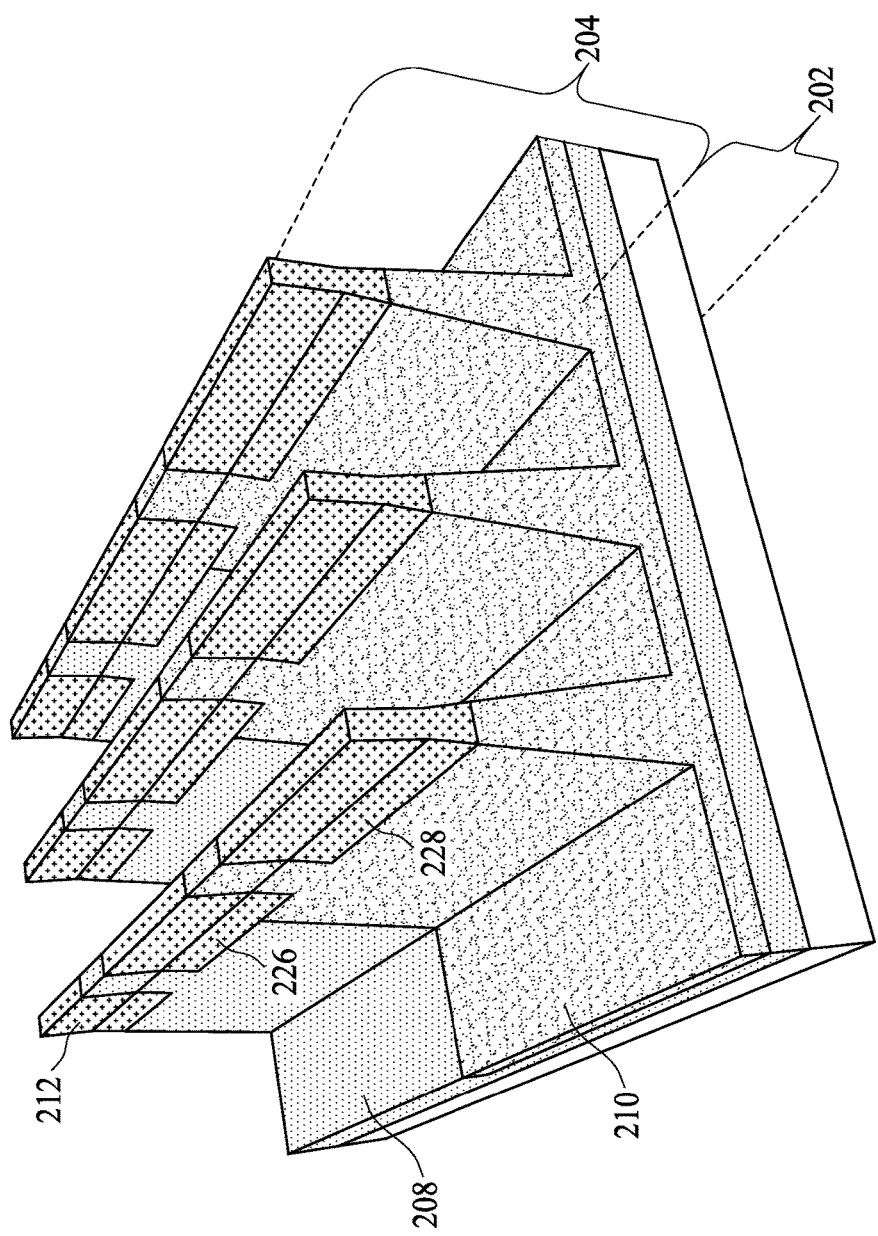
FIG. 8 is a schematic perspective diagram of the fin structures and the substrate of the FinFET structure in FIG. 6 in accordance with some embodiments.

FIG. 8 is a schematic perspective diagram of the fin structures 204 and the substrate 202 of the FinFET structure 200 in FIG. 6 in accordance with some embodiments. Alternative to the embodiments described with reference to FIG. 3 which has the well region 210 that extends to the bottom of the body region 108 in the substrate 102, the well region 210 extends from the sections 226 and 228 down to an intermediate level of the body region 208 in the substrate 202. The intermediate level is above the bottom of the body region 208 in the substrate 202. The ESD current flows substantially vertically from the section 228 and portions of the well region 210 in the fin structures 204 to a portion of the well region 210 in the substrate 202, and then flows substantially vertically and/or laterally from the portion of the well region 210 in the substrate 202 to a portion of the body region 208 in the substrate 202, and then flows substantially vertically from the portion of the body region 208 in the substrate 202, portions of the body region 208 in the fin structures 204 to the source regions 212.

Figure 9:
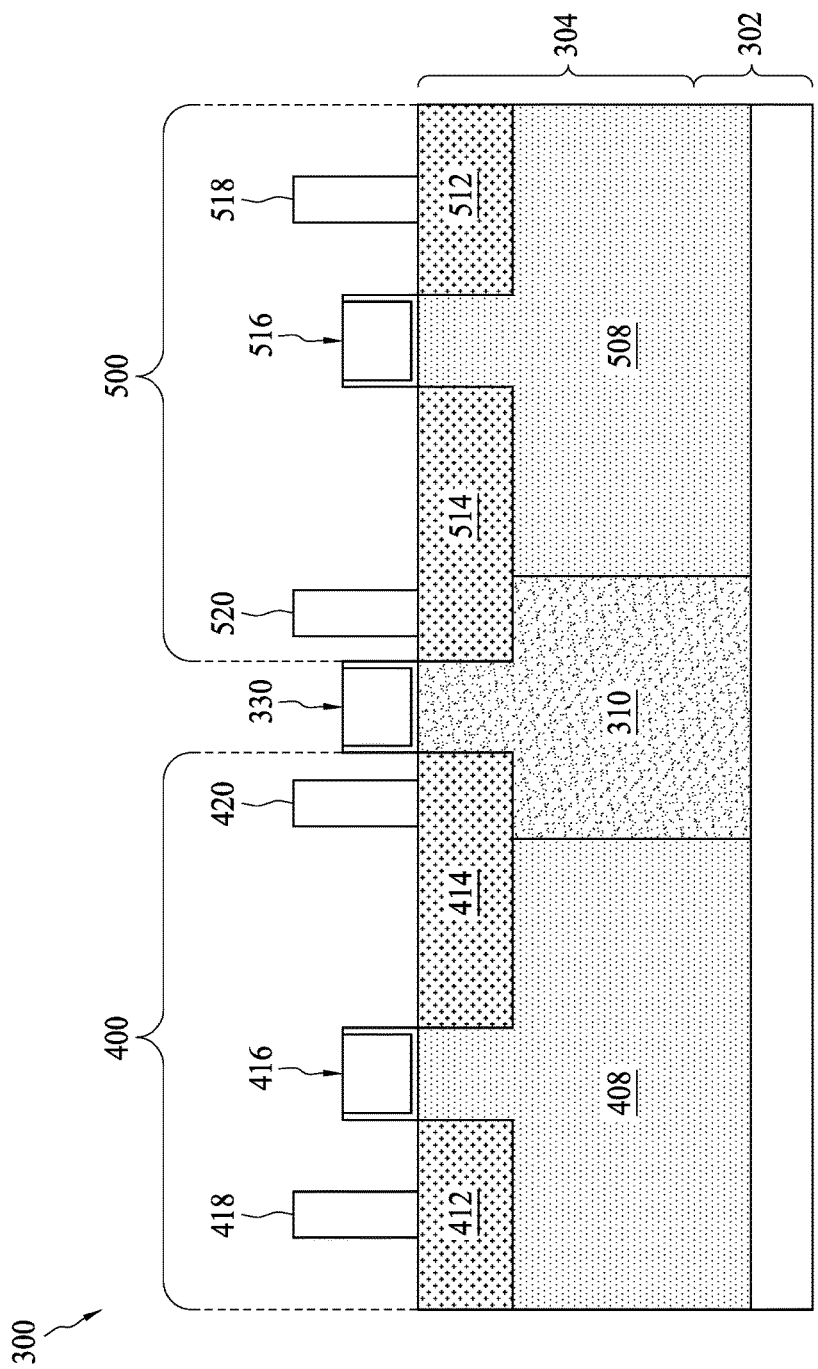
FIG. 9 is a schematic cross-sectional diagram of a multi-gate FinFET structure that includes FinFET structures with coupled drain regions that are divided by a dummy gate structure in accordance with some embodiments.

FIG. 9 is a schematic cross-sectional diagram of a multi-gate FinFET structure 300 that includes FinFET structures 400 and 500 with coupled drain regions that are divided by a dummy gate structure 330 in accordance with some embodiments. As described with reference to FIG. 2, in order to facilitate the ESD current to discharge through the parasitic BJT and not through the channel region, the resistance of the drain region in a path through the channel region is increased. In the embodiments in FIG. 9, two FinFET structures 400 and 500 are connected in parallel to form the multi-gate FinFET structure 300 so that a driving strength of the FinFET structure 300 is increased when the FinFET structure 300 is serving in the normal mode as the functional FET. Further, the ESD current can discharge through both a parasitic BJT of the FinFET structure 400 and the parasitic BIT of the FinFET structure 500 when the FinFET structure is serving in the ESD mode as the ESD protection device.

FIG. 9 shows a cross-section along a length of one of fin structures 304 of the FinFET structure 300. In this cross-section, the FinFET structure 300 includes a substrate 302 and the fin structure 304 that include body regions 408 and 508, embedded source regions 412 and 512, and embedded drain regions 414 and 514 of the FinFET structures 400 and 500, respectively, and a well region 310. The FinFET structure 300 further includes a gate structure 416 of the FinFET structure 400, a gate structure 516 of the FinFET structure 500, and the dummy gate structure 330. The FinFET structure 300 further includes the contacts 418 and 420 of the FinFET structure 400 and the contacts 518 and 520 of the FinFET structure 500. The FinFET structure 400 can be viewed as similar to the FinFET structure 100 described with references to FIGS. 1 to 3, and the FinFET structure 500 is symmetrical to the FinFET structure 400 with respect to the dummy gate structure 330. In the parallel configuration of the FinFET structures 400 and 500, gate structures 416 and 516 are electrically coupled, the embedded source regions 412 and 512 are electrically coupled, and the embedded drain regions 414 and 514 are electrically coupled. The metal lines for forming the parallel configuration are not shown in FIG. 9 for simplicity. Since the embedded drain regions 414 and 514 are coupled and are adjacent to each other, a continuous region can be formed. However, the dummy gate 320 is inserted to divide the coupled drain regions 414 and 514 so that when the stressor material is epitaxially grown to form the embedded source region 412 and the embedded drain region 414 of the FinFET structure 400, and the embedded source region 512 and the embedded drain region 514 of the FinFET structure 514, the epitaxial rate is more uniform.

In some embodiments, the well region 310 is formed across the embedded drain regions 414 and 514, and extends from the embedded drain regions 414 and 514 in the fin structure 304 to the substrate 302. In some embodiments, the contact 420 for the embedded drain region 414, and the contact 520 for the embedded drain region 514 are formed over the well region 310 so that the ESD current can be dispersed to the substrate 302 through the well region 310.

Figure 10:
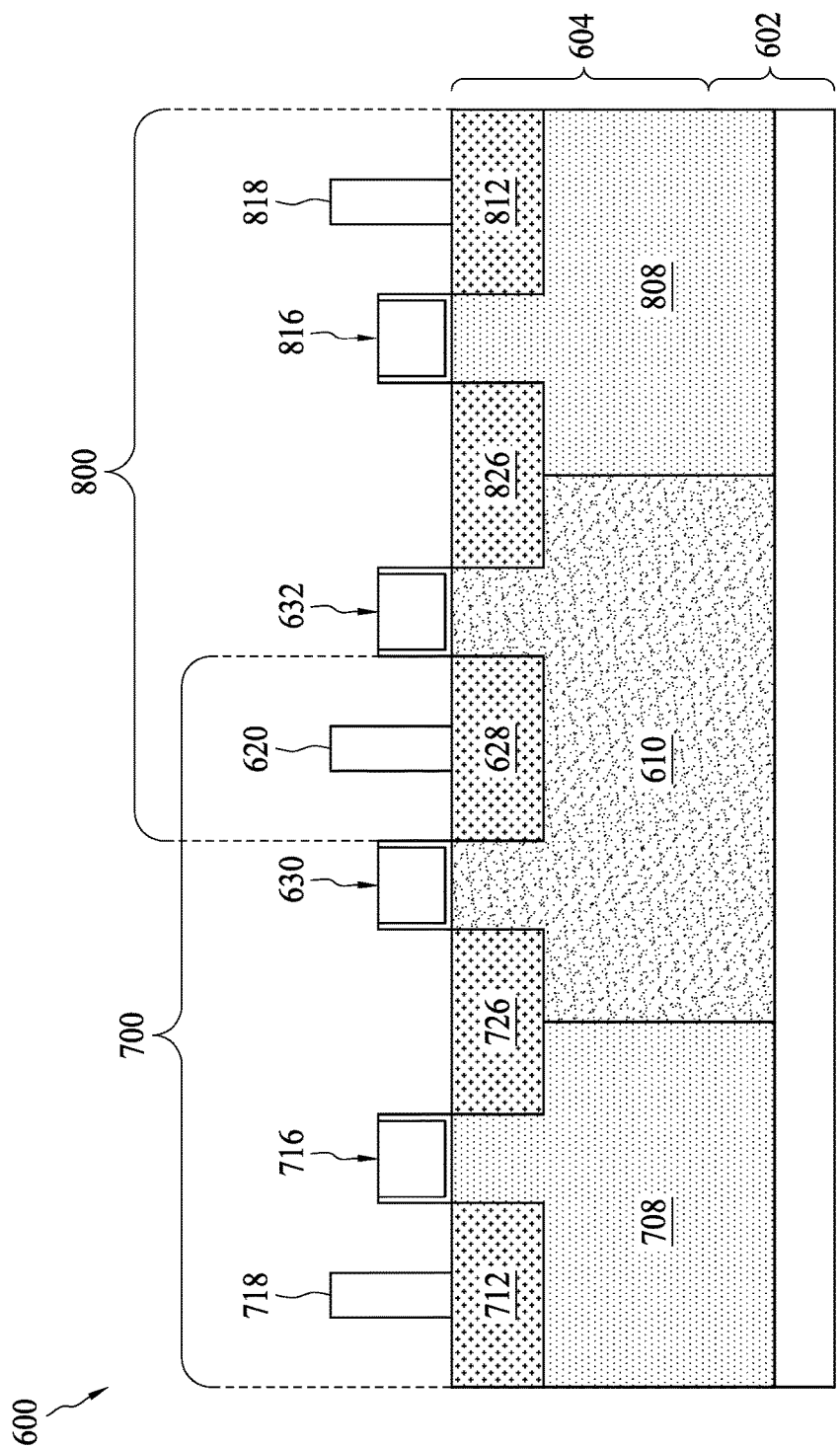
FIG. 10 is a schematic cross-sectional diagram of a multi-gate FinFET structure that includes FinFET structures with coupled drain regions that are divided by several dummy gate structures in accordance with some embodiments.

FIG. 10 is a schematic cross-sectional diagram of a multi-gate FinFET structure 600 that includes FinFET structures 700 and 800 with coupled drain regions that are divided by several dummy gate structures 630 and 632 in accordance with some embodiments. As described with reference to FIG. 7, the resistance of the discharge path through the channel region can be further increased while maintaining the substantially uniform epitaxial rate for the embedded source and drain regions by inserting more dummy gate structures. Compared to the multi-gate FinFET structure 300 in FIG. 9 that uses one dummy gate structure 320 to divide the coupled drain regions of the FinFET structures 400 and 500, the multi-gate FinFET structure 600 uses several dummy gate structures 630 and 632 to divided the coupled drain regions of the FinFET structures 700 and 800.

In FIG. 10, the FinFET structure 600 includes a substrate 602, and the fin structure 604 that includes a body region 708, an embedded source region 712 and sections 726 and 628 of an embedded drain region of the FinFET structure 700, a body region 808, an embedded source region 812 and sections 826 and 628 of an embedded drain region of the FinFET structure 800, and a well region 610. The FinFET structure 600 further includes a gate structure 716 and the dummy gate structure 630 of the FinFET structure 700, and a gate structure 816 and the dummy gate structure 632 of the FinFET structure 800. The FinFET structure 600 further includes the contacts 718 and 818 for the embedded source regions 712 and 812 of the Fin FET structures 700 and 800, respectively, and the contact 620 for the section 628 of the coupled drain regions of the FinFET structures 700 and 800. The FinFET structure 700 can be viewed as similar to the FinFET structure 200 described with reference to FIGS. 6 to 8, and the FinFET structure 800 is symmetrical to the FinFET structure 700 with respect to the contact 620. The dummy gates 630 and 632 are inserted to divide the coupled drain regions of the FinFET structures 700 and 800 into three sections 726, 628 and 812. The coupled drain regions of the FinFET structures 700 and 800 have the overlapped section 628. The contact 620 is shared between the FinFET structures 700 and 800.

In some embodiments, the well region 610 connects the sections 726, 628 and 826 of the embedded drain regions of the FinFET structures 700 and 800, and extends from the sections 726, 628 and 826 in the fin structure 604 to the substrate 602. In some embodiments, the contact 620 shared between the embedded drain region of the FinFET structure 700 and the embedded drain region of the FinFET structure 800 is formed over the well region 610 so that the ESD current can be dispersed to the substrate 602 through the well region 610. Further, in some embodiments, the contact 620 is formed on the section 628 so that each of the FinFET structure 700 and the FinFET structure 800 has increased resistance in the respective path through the respective channel region.

FIGS. 11A to 11H are schematic perspective diagrams of structures formed by each operation of a method for fabricating a FinFET structure 900 (shown in FIG. 11H) in accordance with some embodiments. The FinFET structure 900 is similar to the FinFET structure 200 in FIGS. 6 to 8. Other FinFET structures 100, 300 and 600 can be fabricated using similar or fewer operations.

Figure 11A:
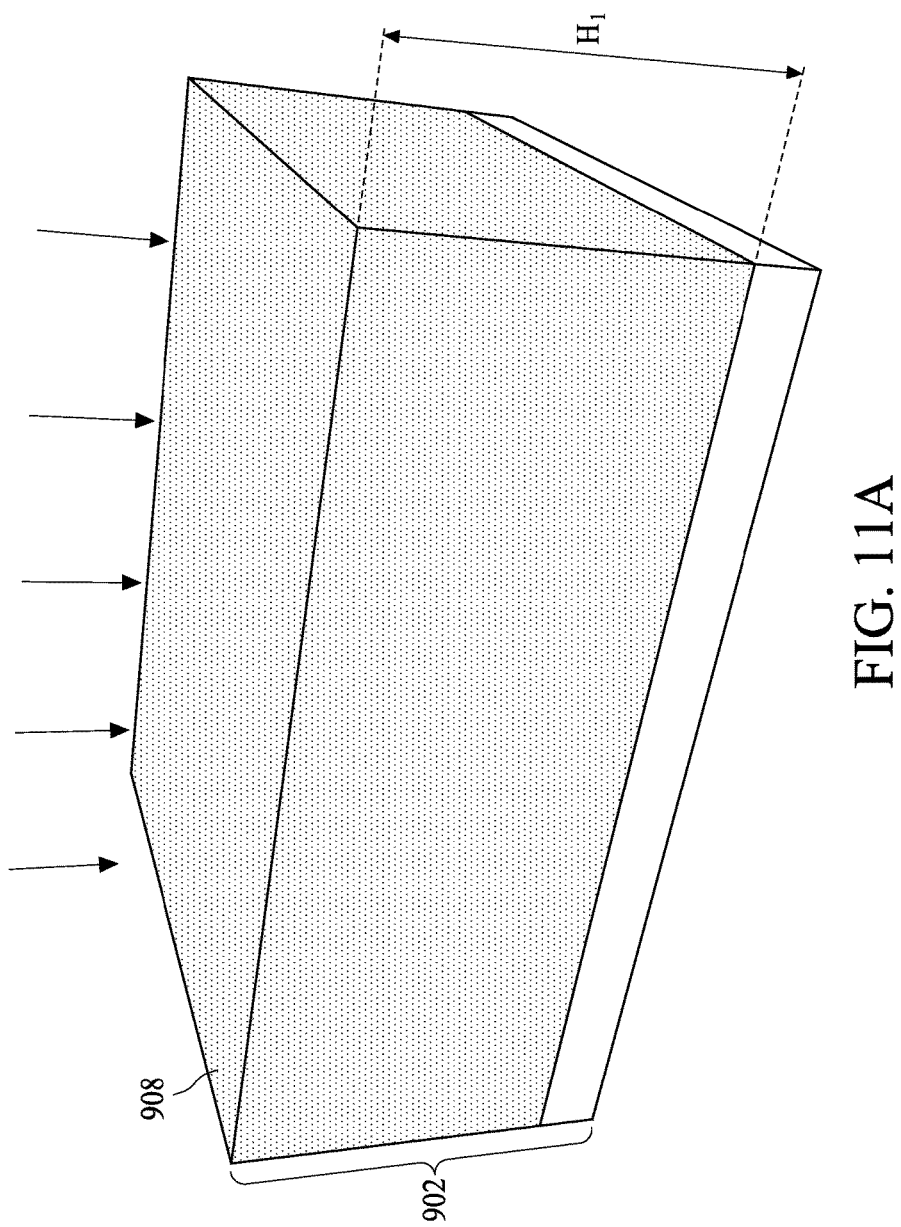
FIGS. 11A to 11B are schematic perspective diagrams of structures formed by each operation of a method for fabricating a FinFET structure in accordance with some embodiments.

FIG. 11A illustrates formation of a body region 908 in accordance with some embodiments. In some embodiments, a bulk semiconductor substrate 902 as described with reference to FIG. 1 is provided. Doping is performed to form the body region 908 with a depth $H_1$ in the substrate 902. For an n-type FET, the body region 908 is doped with n-type dopants, and for a p-type FET, the body region 908 is doped with p-type dopants. In some embodiments, doping is performed via ion implantation.

Figure 11B:
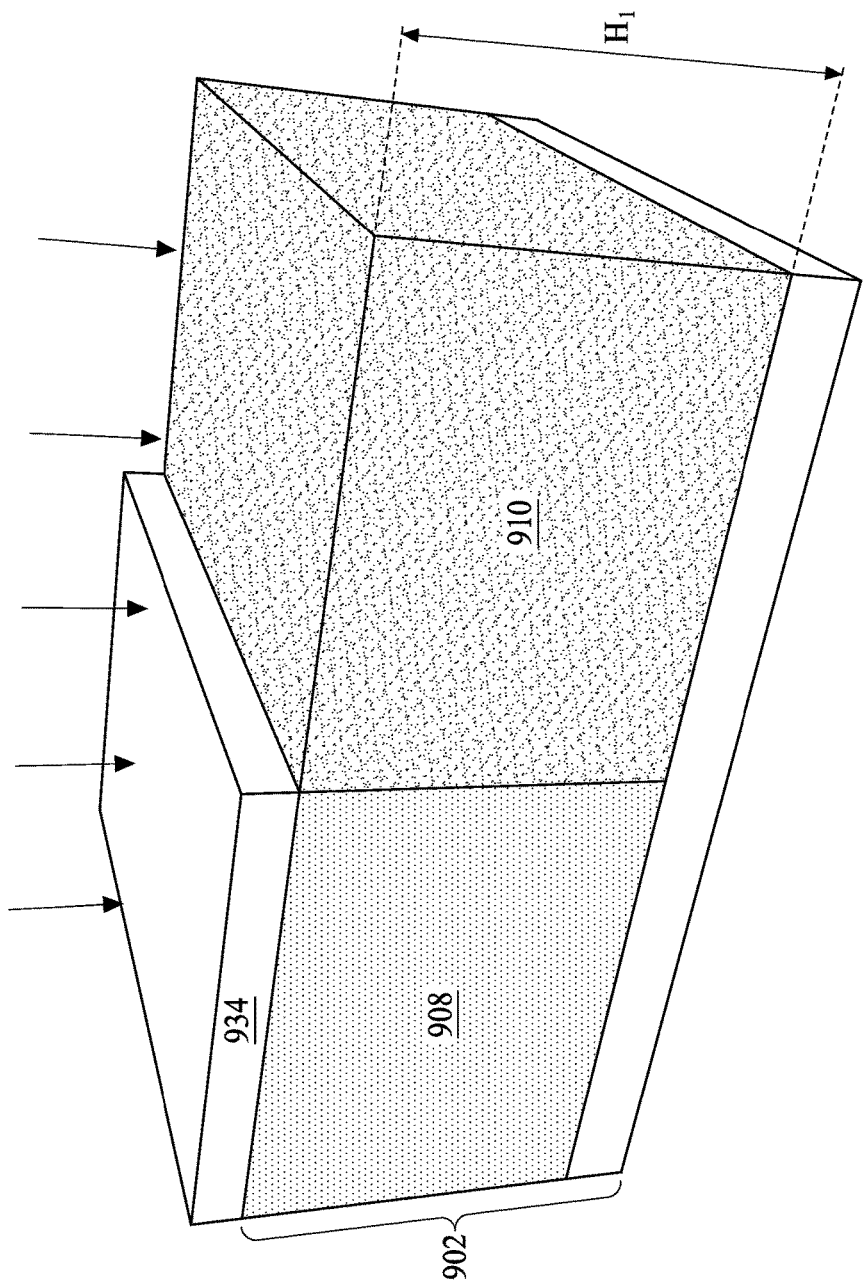

FIG. 11B illustrates formation of a well region 910 in accordance with some embodiments. A photoresist layer is blanket deposited on the substrate 902 in FIG. 11A and is patterned into a photoresist mask 934 to expose a portion of the body region 908. Doping is performed on the exposed body region 908 to form the well region 910 with the depth $H_1$ in the substrate 902. The conductivity type of dopants of the well region 910 is opposite to that of the body region 908. In some embodiments, doping is performed via ion implantation.

Figure 11C:
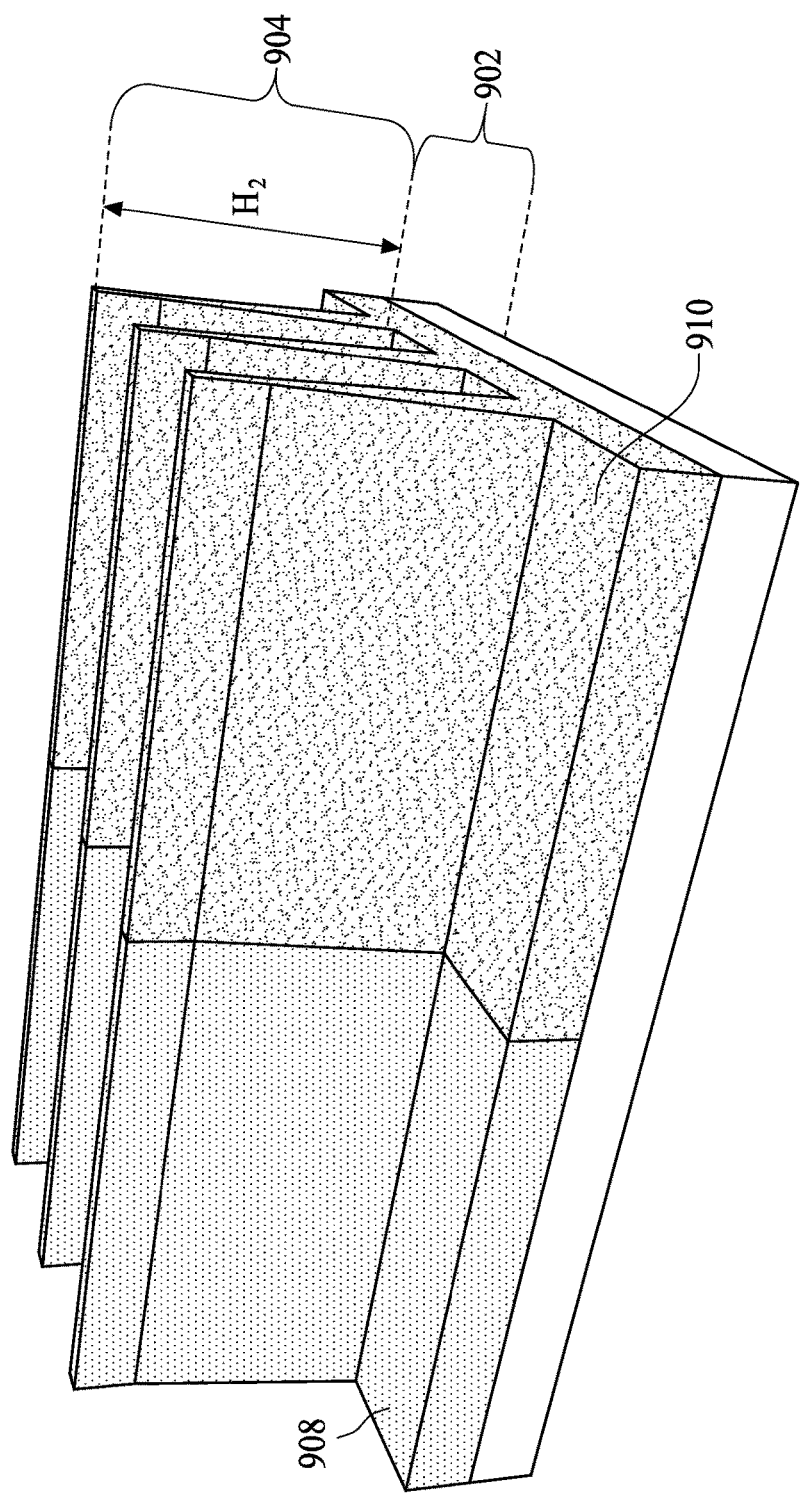

FIG. 11C illustrates formation of fin structures 904 in accordance with some embodiments. In some embodiments, the fin structures 904 is formed by etching trenches in the substrate 902 in FIG. 11B. Bottom surfaces of trenches form a top surface of the remaining substrate 902, and side walls of the trenches form the fin structures 902 that extend from the top surface of the substrate 902. In some embodiments, the trenches have a depth $H_2$ which is also a height $H_2$ of the fin structures 904. The height $H_2$ of the fin structures 904 is smaller than the depth $H_1$ (shown in FIGS. 11A and 11B) of the body region 908 and the well region 910. Therefore, the body region 908 spans the fin structures 904 and the substrate 902. The well region 910 also spans the fin structures 904 and the substrate 902.

Figure 11D:
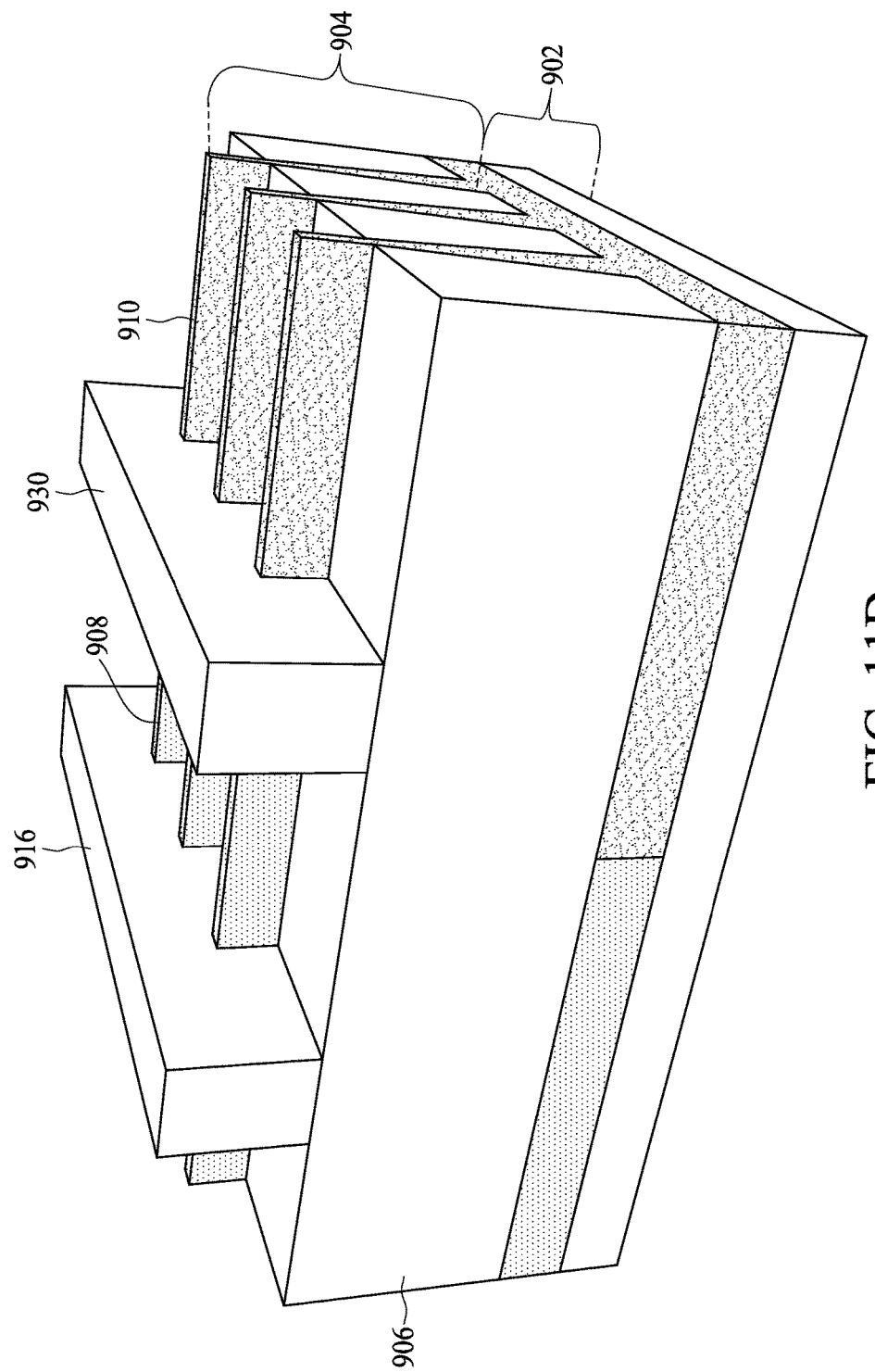

FIG. 11D illustrates formation of dielectric isolation regions 906, a sacrificial gate structure 916 and a sacrificial dummy gate structure 930 in accordance with some embodiments. In some embodiments, the trenches in FIG. 11C are filled with a dielectric material as described with references to FIG. 1 to form the dielectric isolation regions 906. In some embodiments, the dielectric isolation regions 906 are further etched so that the fin structures 904 extend beyond the dielectric isolation regions 906. In other embodiments, the portions of the fin structures 904 extended beyond the dielectric isolation regions 906 are epitaxially grown.

In some embodiments, a replacement gate process that replaces sacrificial gate structures with metal gate structures after formation of embedded source and drain regions is used. To form the sacrificial gate structure 916 and the sacrificial dummy gate structure 930 that wraps around the fin structures 904, a sacrificial gate electrode layer is blanket deposited on the dielectric isolation regions 906 and the fin structures 904. One or more hard mask layers are deposited on the sacrificial gate electrode layer, and a photoresist layer is deposited on the one or more hard mask layers. The photoresist layer is then patterned into a photoresist mask that defines areas where the sacrificial gate structure 916 and the sacrificial dummy gate structure 930 are desired. In some embodiments, the area of the sacrificial gate structure 916 corresponds to a portion of the body region 908 and the area of the sacrificial dummy gate structure 930 corresponds to a portion of the well region 910. The pattern of the photoresist mask is transferred to the one or more hard mask layers to form a hard mask. The pattern of the hard mask is transferred to the sacrificial gate electrode layer to form the sacrificial gate structure 916 and the sacrificial dummy gate structure 930. Then, the photoresist mask is removed. In some embodiments, the sacrificial gate electrode includes polysilicon, and the hard mask includes $SiO_2$, $Si_3N_4$ or SiON.

In addition, in some embodiments, side wall spacers (not shown) are formed on side walls of the sacrificial gate structure 916 and the sacrificial dummy gate structure 930 but are not shown in FIG. 11D for simplicity.

Figure 11E:
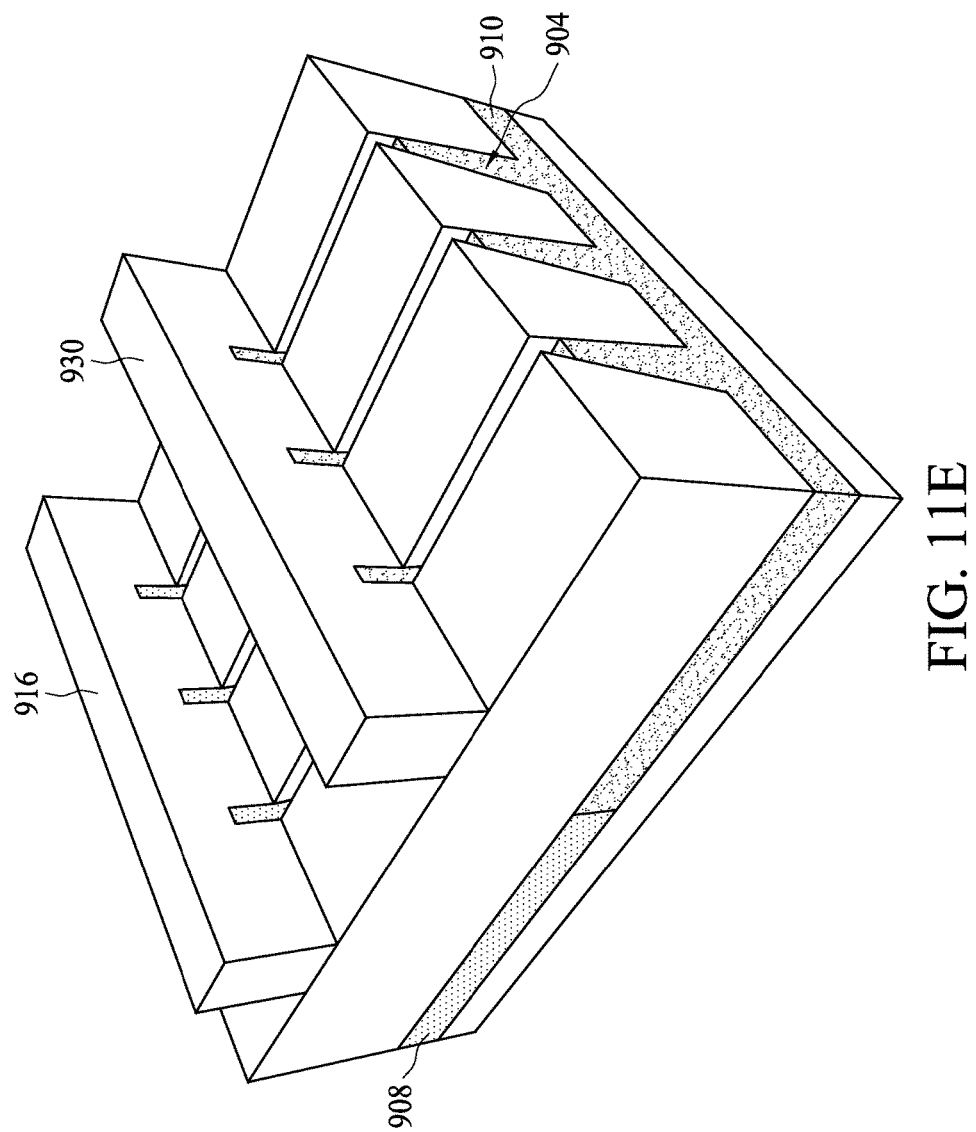

FIG. 11E illustrates formation of recesses in the fin structures 904 on opposite sides of the sacrificial gate structure 916 and the sacrificial dummy gate structure 930 in accordance with some embodiments. In some embodiments, a recess is formed in the body region 908 in the fin structure 904 on a left side of the sacrificial gate structure 916, a recess is formed in the body region 908 and the well region 910 in the fin structure 904 between the sacrificial gate structure 916 and the sacrificial dummy gate structure 930, and a recess is formed in the well region 910 in the fin structure 904 on a right side of the sacrificial dummy gate structure 930. In some embodiments, the recesses are offset by the side wall spacers (not shown).

In some embodiments, regions in the body region 908 and the well region 910 to be removed are doped with, for example, n-type dopants to enhance an etch rate. The recesses are then formed using dry etching.

In some embodiments, each recess has a symmetrical profile such as a round profile. For simplicity, each recess is shown to have a rectangular profile in FIG. 11E. In some embodiments, in order to form the recesses with the symmetrical profiles, additional sacrificial gate structures (not shown) are formed so that each recess is formed between two adjacent sacrificial gate structures.

Figure 11F:
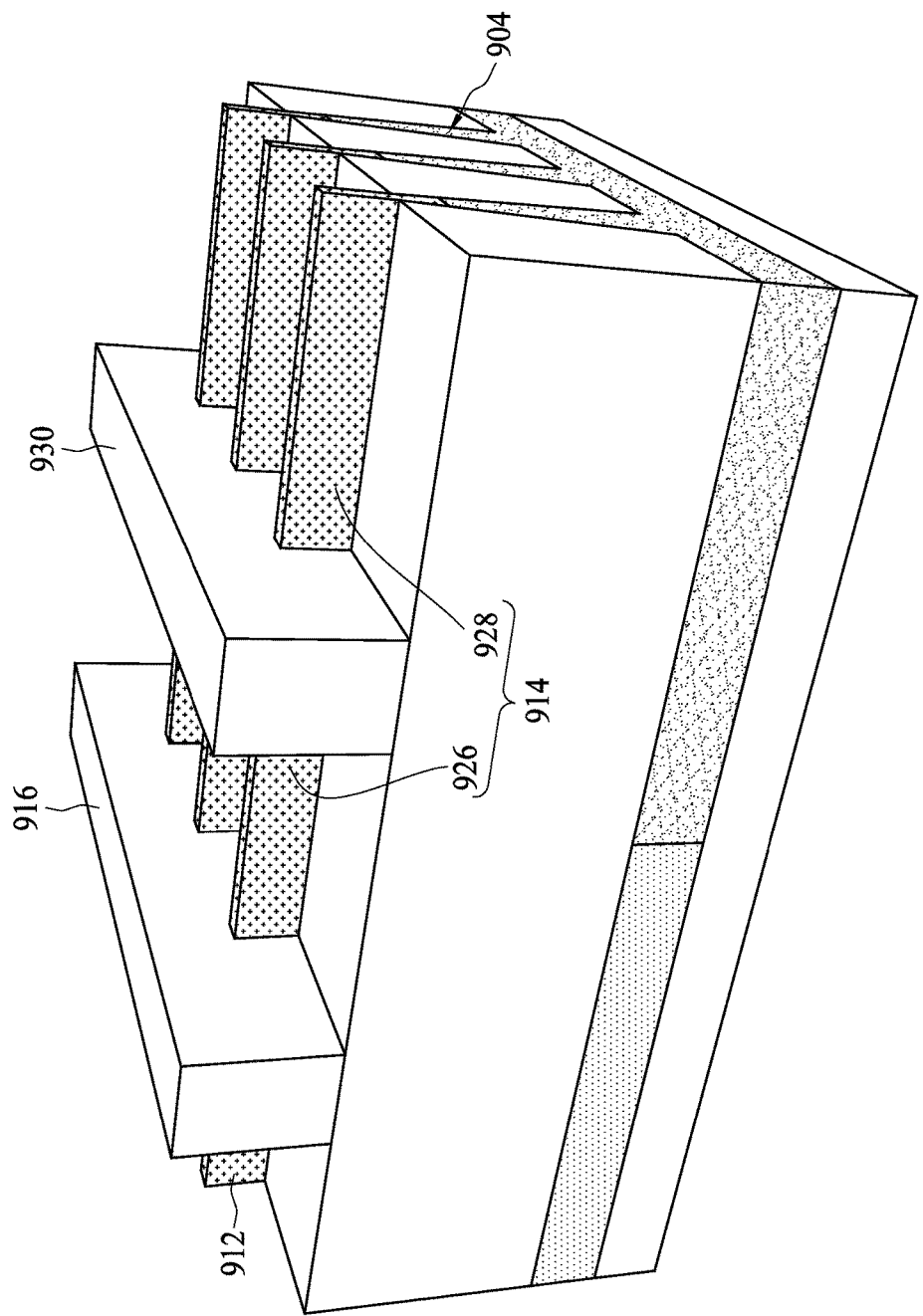

FIG. 11F illustrates formation of embedded stressor regions 912 and 914 in the recesses in the fin structures 904 in accordance with some embodiments, in some embodiments, a stressor material is grown in the recesses in FIG. 11E to form the embedded stressor regions 912 and 914. Exemplary stressor materials have been described with reference to FIG. 7. In some embodiments, the stressor material is grown using a selective epitaxial deposition process. The embedded stressor region 914 includes sections 926 and 928 formed in the recesses on the opposite sides of the sacrificial dummy gate structure 930. Because a size of each of the sections 926 and 928 is more compatible with a size of the embedded stressor region 912, an epitaxial growth rate across the embedded stressor region 912, and the sections of the embedded stressor region 914 is more uniform.

Figure 11G:
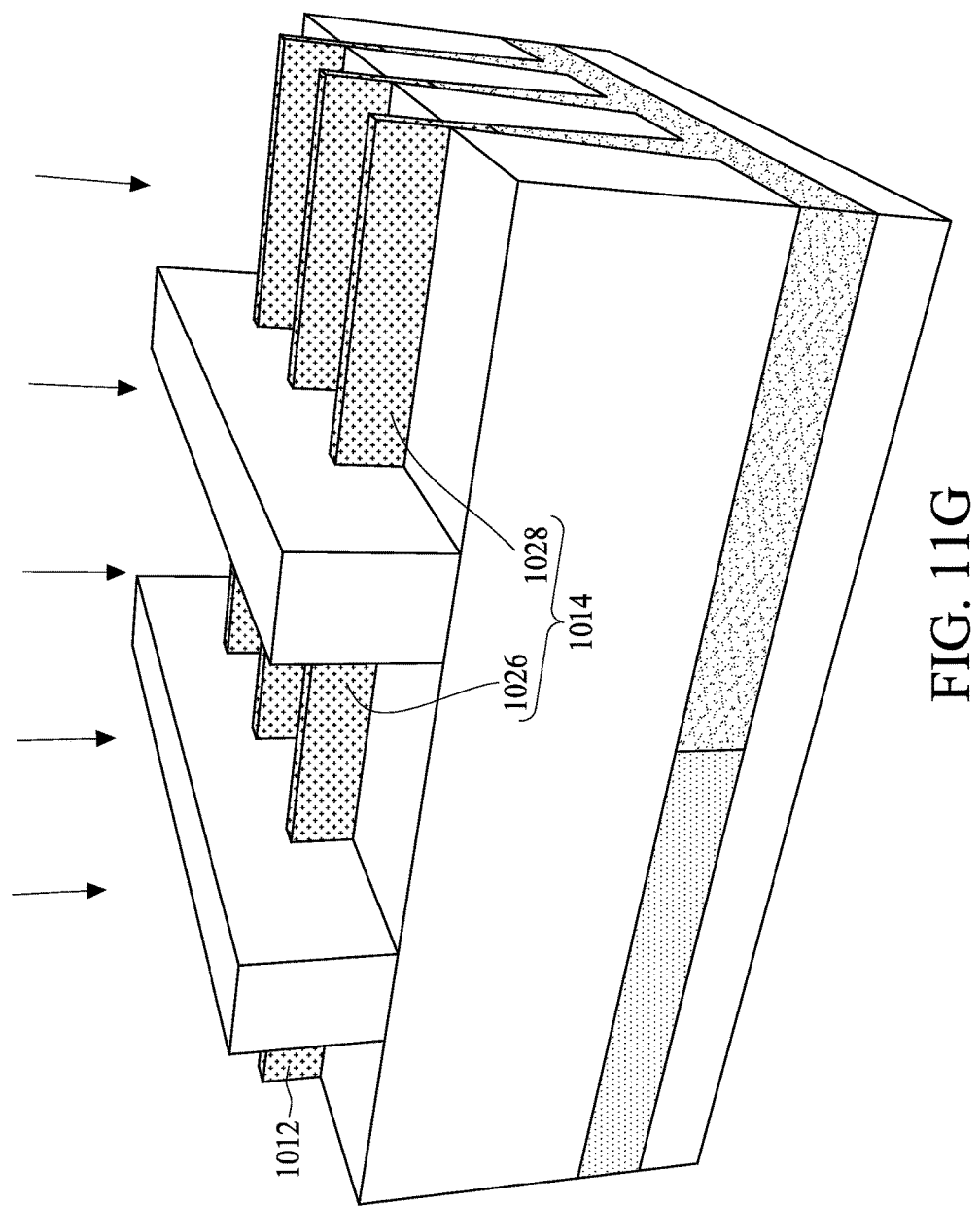

FIG. 11G illustrates formation an embedded source region 1012 and an embedded drain region 1014 in accordance with some embodiments. In some embodiments, the embedded stressor regions 912 and 914 are doped with dopants of the same conductivity type as the well region 910 (labeled in FIG. 11E) to form the embedded source region 1012 and the embedded drain region 1014. In some embodiments, doping is performed using ion implantation. In other embodiments, the embedded stressor regions 912 and 914 are in-situ doped.

Figure 11H:
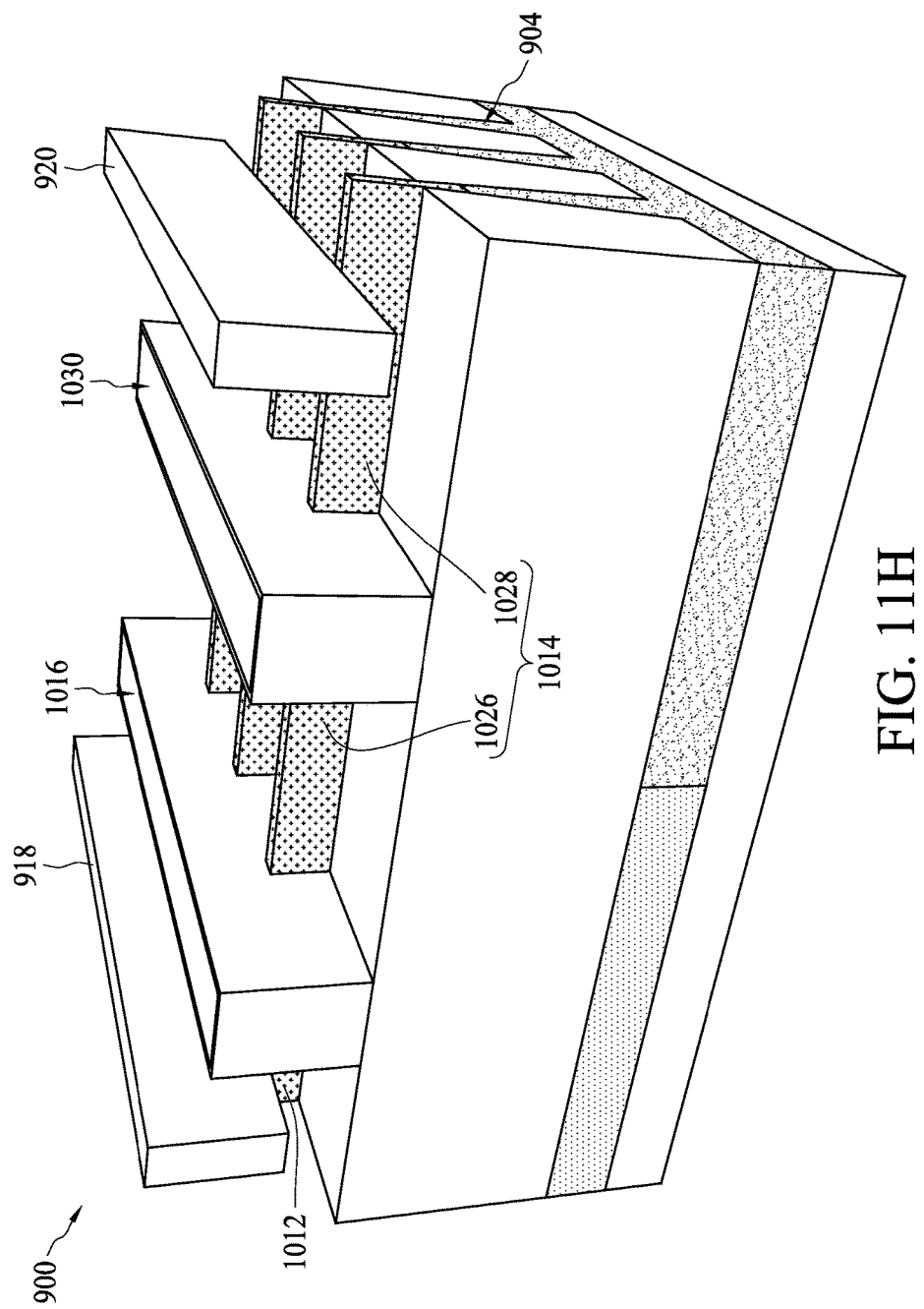

FIG. 11H illustrates formation of a replacement gate structure 1016, a replacement dummy gate structure 1030 and contacts 918 and 920 in accordance with some embodiments. In some embodiments, to form the replacement gate structure 1016 and the replacement dummy gate structure 1030, a first interlayer dielectric (ILD) layer is blanket deposited on the embedded source and drain regions 1012 and 1014, the sacrificial gate structure 916, the sacrificial dummy gate structure 930, and the dielectric isolation regions 906. The first ILD layer is planarized until a top surface of the first ILD layer is planar, for example, a top surface of the hard mask of the sacrificial gate structure 916. The sacrificial gate structure 916 and the sacrificial dummy gate structure 930 are removed, forming trenches that expose the fin structures 904 underlying the sacrificial gate structure 916 and the sacrificial dummy gate structure 930. One or more gate dielectric layers are conformally deposited in the trenches, covering the exposed portions of the fin structures 904. One or more work function metal layers are conformally deposited on the one or more gate dielectric layers. A fill metal filling the remaining portions of the trenches are formed as a capping layer over the first ILD layer and is planarized until a top surface of a gate electrode planar the top surface of the first ILD layer. Exemplary materials of the one or more gate dielectric layers, the one or more work function metal layers and the fill metal have been described with reference to FIG. 2.

In addition, in some embodiments, to form the contacts 918 and 920, a silicide last process is used. A second ILD layer is blanket deposited on the gate structure 1016, the dummy gate structure 1030 and the first ILD layer. Openings where the contacts 918 and 920 are to be formed are formed into the ILD layers. A silicide material is formed on the embedded source region 1012 and the section 1028 of the embedded drain region 1014 exposed by the openings. A metal material filling the remaining portions of the openings is formed. Exemplary silicide materials and metal materials have been described with reference to FIG. 1. Alternatively, the silicide material on the embedded source region 1012 and the embedded drain region 1014 can be formed before the first ILD layer is formed.

Some embodiments have one or a combination of the following features and/or advantages. In some embodiments, in the FinFET structure serving both as the functional FET and the ESD protection device, the well region extended from the drain region in the fin structures to the substrate is formed. The well region facilitates diverting a portion of the ESD current flowing through the fin structures to the substrate, thereby increasing a peak current that the FinFET structure can sustain even in an ESD event with a sharp current transition such as that modeled by the COM. In addition, in some embodiments, the resistance of the drain region in the path through the channel region of the FinFET structure is increased to avoid the ESD current from discharging through and damaging the channel region. Moreover, in some embodiments, the resistance of the drain region is increased by increasing a distance between the contact of the drain region to the gate structure. The drain region is divided into sections by the at least one dummy gate structure so that the growth rate of the stressor material is substantially uniform across the source and drain regions. Furthermore, in some embodiment, the multi-gate FinFET structure includes the FinFET structure and a structure symmetrical to the FinFET structure with the coupled drain regions that are divided by the at least one dummy gate structure. Therefore, during the normal mode of the multi-gate FinFET structure, the driving strength is increased. During the ESD mode of the multi-gate FinFET structure, the discharge path of the ESD current is expanded to include both the parasitic BJT in the FinFET structure and the parasitic BJT in the symmetrical structure.

In some embodiments, a field effect transistor (FET) structure includes a substrate, a fin structure and a gate structure. The fin structure is formed over the substrate. The fin structure includes a first channel region, a first source or drain region and a second source or drain region. The first source or drain region and the second source or drain region are formed on opposite ends of the first channel region, respectively. The well region is formed of the same conductivity type as the second source or drain region, connected to the second source or drain region, and extended to the substrate. The first gate structure wraps around the first channel region in the fin structure.

In some embodiments, in a method, a substrate is provided. A well region is formed in the substrate. The well region extends to a first depth of the substrate. Portions of the substrate are removed to form a fin structure including a portion of the well region, and having a height not exceeding the first depth of the substrate. A first source or drain region and a second source or drain region of the same conductivity type as the well region are formed in the fin structure. The first source or drain region and the second source or drain region are formed on opposite ends of a first channel region in the fin structure, respectively. The first gate structure that wraps around the first channel region is formed.

In some embodiments, an FET structure includes a body region, a well region, a first source or drain region and a second source or drain region and a first gate structure. The body region abuts the well region of the opposite conductivity type to the body region. Each of the body region and the well region includes a first portion and a second portion. The first portion has at least one width smaller than a first width. The second portion has the first width. The first source or drain region and the second source or drain region are embedded into the first portions of the body region and the well region. The first gate structure wraps around the first portion between the first source or drain region and the second source or drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate;
forming a well region in the substrate,
wherein the well region extends to a first depth of the substrate;
removing portions of the substrate to form a fin structure comprising a portion of the well region, and having a height not exceeding the first depth of the substrate,
forming a first gate structure that wraps around a first channel region of the fin structure; and
replacing portions of the fin structure on opposite ends of the first channel region with a first source or drain region and a second source or drain region of the same conductivity type as the well region, so that the well region being free from extending to a top end of the fin structure unwrapped by the first gate structure,
wherein
the second source or drain region is connected to the well region.

2. The method of claim 1, further comprising:
removing other portions of the substrate to form another fin structure comprising another portion of the well region, and having the height,
wherein the first depth is larger than the height of the fin structure and the other fin structure.

3. The method of claim 1, wherein the second source or drain region has a longer length than the first source or drain region.

4. The method of claim 3, further comprising:
forming a third source or drain region and a fourth source or drain region of the same conductivity type as the well region in the fin structure,
wherein the third source or drain region and the fourth source or drain region are formed on opposite ends of a second channel region in the fin structure, respectively;
the fourth source or drain region is connected to the well region; and
the second source or drain region and the fourth source or drain region are adjacent or overlapped; and
forming a second gate structure that wraps around the second channel region in the fin structure.

5. The method of claim 4, wherein the formed second source or drain region and the fourth source or drain region comprise a stressor material that has a lattice constant different from that of the first channel region and the second channel region, respectively.

6. The method of claim 5, further comprising:
forming at least one dummy gate structure whereby during formation of the second source or drain region and the fourth source or drain region, the adjacent or overlapped second source or drain region and fourth source or drain region are divided into a plurality of sections.

7. The method of claim 3, further comprising:
forming at least one contact over the well region.

8. A method, comprising:
providing a substrate;
forming a well region in the substrate,
wherein the well region extends to a first depth of the substrate;
removing portions of the substrate to form a fin structure comprising a portion of the well region, and having a height not exceeding the first depth of the substrate;
forming dielectric isolation regions on the substrate and at opposite sides the fin structure;
forming a sacrificial gate structure and a sacrificial dummy gate structure over the fin structure and the substrate; and
replacing a first portion and a second portion of the fin structure by a first source or drain region and a second source or drain region of the same conductivity type as the well region in the fin structure,
wherein the first source or drain region and the second source or drain region are formed on and abutting opposite ends of a first channel region in the fin structure, respectively; and the second source or drain region is connected to the well region.

9. The method of claim 8, wherein the replacement of the first portion and the second portion of the fin structure by the first source or drain region and the second source or drain region of the same conductivity type as the well region in the fin structure comprises:
forming recesses in the fin structures on opposite sides of the sacrificial gate structure.

10. The method of claim 9, wherein the replacement of the first portion and the second portion of the fin structure by the first source or drain region and the second source or drain region of the same conductivity type as the well region in the fin structure further comprises:
forming embedded stressor regions in the recesses in the fin structures.

11. The method of claim 10, wherein the replacement of the first portion and the second portion of the fin structure by the first source or drain region and the second source or drain region of the same conductivity type as the well region in the fin structure further comprises:
doping the embedded stressor regions with dopants of the same conductivity type as the well region in the fin structure.

12. The method of claim 11, wherein the doping of the embedded stressor regions with dopants of the same conductivity type as the well region in the fin structure comprises:

doping the embedded stressor regions with dopants of the same conductivity type as the well region in the fin structure, so that the embedded stressor regions are more heavily doped than the well region.

13. The method of claim 8, further comprising:
forming a replacement gate structure and a replacement dummy gate structure over the fin structure and the substrate.

14. The method of claim 8, further comprising:
forming a contact over the fin structure and the substrate.

15. The method of claim 8, wherein the second source or drain region has a longer length than the first source or drain region.

16. A method, comprising:
providing a substrate;
forming a well region in the substrate;
etching trenches in the substrate to define a fin structure comprising a portion of the well region;
filling dielectric material in the trenches;
forming a sacrificial gate structure and a sacrificial dummy gate structure over the substrate and wrapping around the fin structure; and
forming a first source or drain region and a second source or drain region of the same conductivity type as the well region in the fin structure,
wherein the first source or drain region and the second source or drain region are formed in the fin structure, and the first source or drain region and the second source or drain region abut opposite ends of a channel region which locates under the sacrificial gate structure in the fin structure, and the second source or drain region is connected to the well region.

17. The method of claim 16, further comprising:
forming a third source or drain region of the same conductivity type as the well region in the fin structure, and the second source or drain region and the third source or drain region abut opposite ends of a region which locates under the sacrificial dummy gate structure in the fin structure, and the third source or drain region is connected to the well region.

18. The method of claim 16, further comprising:
removing the sacrificial gate structure and the sacrificial dummy gate structure.

19. The method of claim 18, further comprising:
forming a replacement gate structure and a replacement dummy gate structure over the fin structure and the substrate.

20. The method of claim 16, further comprising:
forming a contact over the fin structure and the substrate.

\* \* \* \* \*